(12) United States Patent
Kawai et al.

(10) Patent No.: US 11,527,352 B2
(45) Date of Patent: Dec. 13, 2022

(54) ELECTRONIC COMPONENT, ELECTRONIC-COMPONENT MOUNTING BOARD, AND ELECTRONIC-COMPONENT MANUFACTURING METHOD

(71) Applicant: Murata Manufacturing Co., Ltd., Kyoto-fu (JP)

(72) Inventors: Hiraku Kawai, Nagaokakyo (JP);
Noboru Shiokawa, Nagaokakyo (JP);
Yuichi Iida, Nagaokakyo (JP);
Yoshitaka Matsuki, Nagaokakyo (JP);
Masahiro Kubota, Nagaokakyo (JP);
Kenji Nishiyama, Nagaokakyo (JP);
Takaya Wada, Nagaokakyo (JP);
Tadashi Washimori, Nagaokakyo (JP);
Rikiya Sano, Nagaokakyo (JP);
Chiharu Sakaki, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 383 days.

(21) Appl. No.: 16/838,918

(22) Filed: Apr. 2, 2020

(65) Prior Publication Data

US 2020/0321157 A1    Oct. 8, 2020

Related U.S. Application Data

(60) Provisional application No. 62/830,158, filed on Apr. 5, 2019.

(51) Int. Cl.
| | | |
|---|---|---|
| H01F 27/29 | (2006.01) | |
| H03H 7/01 | (2006.01) | |
| H01G 4/228 | (2006.01) | |
| H01F 41/04 | (2006.01) | |
| H01F 27/28 | (2006.01) | |
| H03H 1/00 | (2006.01) | |

(52) U.S. Cl.
CPC ....... *H01F 27/292* (2013.01); *H01F 27/2804* (2013.01); *H01F 41/041* (2013.01); *H01G 4/228* (2013.01); *H03H 7/0115* (2013.01); *H03H 2001/0085* (2013.01)

(58) Field of Classification Search
CPC .......... H01F 27/292; H03H 2001/0085; H03H 7/0115
USPC .................................................. 333/175, 185
See application file for complete search history.

(56) References Cited

U.S. PATENT DOCUMENTS 6,060,968 A  *  5/2000  Baltus ..................... H01L 23/66
                                              257/664
11,342,896 B2 *  5/2022  Flemming ............. H01P 11/003

FOREIGN PATENT DOCUMENTS

| CN | 104737246 A | 6/2015 |
|---|---|---|
| JP | H06-325977 A | 11/1994 |
| JP | H11-297533 A | 10/1999 |
| JP | 2002-111220 A | 4/2002 |
| JP | 2002-252101 A | 9/2002 |

(Continued)

*Primary Examiner* — Rakesh B Patel
(74) *Attorney, Agent, or Firm* — Studebaker & Brackett PC

(57) ABSTRACT

An electronic component includes a single-layer glass plate, an outer-surface conductor that is disposed above an outer surface of the single-layer glass plate and that is at least a part of an electrical element, and a terminal electrode that is a terminal of the electrical element. The terminal electrode is disposed above the outer surface of the single-layer glass plate and being electrically connected to the outer-surface conductor.

23 Claims, 10 Drawing Sheets

(56) References Cited

FOREIGN PATENT DOCUMENTS

| | | | |
|---|---|---|---|
| JP | 2009-260106 | A | 11/2009 |
| JP | 2013-98350 | A | 5/2013 |
| JP | 2013-183007 | A | 9/2013 |
| JP | 2015-046494 | A | 3/2015 |
| JP | 2018-078133 | A | 5/2018 |

\* cited by examiner

ELECTRONIC COMPONENT, ELECTRONIC-COMPONENT MOUNTING BOARD, AND ELECTRONIC-COMPONENT MANUFACTURING METHOD

CROSS-REFERENCE TO RELATED APPLICATION

This application claims benefit of priority to U.S. Provisional Patent Application No. 62/830,158, filed Apr. 5, 2019, the entire content of which is incorporated herein by reference.

BACKGROUND

Technical Field

The present disclosure relates to an electronic component, an electronic-component mounting board, and an electronic-component manufacturing method.

Background Art

Japanese Unexamined Patent Application Publication No. 2013-98350 discloses a method of manufacturing a multi-layer-type inductor component including a multi-layer glass body having a conductor placed in its interior. Specifically, first, a plurality of glass green sheets having a conductor paste coated thereon by printing are provided, the glass green sheets being glass pastes containing glass powder that have been formed into sheets and the conductor paste containing conductor powder, such as Ag or Cu powder. Next, the plurality of glass green sheets having the conductor paste coated thereon by printing are stacked and are cut into individual pieces. Here, end portions of the conductor paste are exposed from the individual pieces.

Next, the individual pieces are fired, and the multi-layer glass body in which the glass pastes have been sintered and an internal conductor in which the conductor paste has been sintered is formed. Here, the internal conductor is integrated with the multi-layer glass body and is placed in the multi-layer glass body with only the end portions exposed.

Next, the end portions of the internal conductor exposed from the multi-layer glass body are plated to form a terminal electrode for electrical connection with the outside. This causes a multi-layer-type inductor component including an inductor element formed from the internal conductor and the terminal electrode to be completed.

Due to the advantages, such as the insulation property and the physical/chemical stabilities, of glass, glass is widely used as insulators and structural bodies of electronic components. In particular, as in Japanese Unexamined Patent Application Publication No. 2013-98350, multi-layer-type inductor components having a structure in which an internal conductor is placed in a multi-layer glass body are suitable as small inductor components that are used for high-frequency signals and that are required to have a nonmagnetic structure.

On the other hand, electronic components having a structure in which an internal conductor is placed in a multi-layer glass body are largely affected by firing. Specifically, when, by firing, a glass paste and a conductor paste are sintered and become a multi-layer glass body and an internal conductor, respectively, glass powder and conductor powder are baked and tightened in addition to organic material, which is a paste component, being volatilized. Therefore, no matter how high the precisions of the shapes and the positional relationships when forming the glass paste and the conductor paste are made, the shapes and the positional relationships of the multi-layer glass body and the internal conductor after the firing differ from those when the pastes are being formed. Therefore, variations cannot be prevented from occurring in the final shapes and characteristics after the firing of electronic components having a structure in which an internal conductor is placed in a multi-layer glass body.

In electronic components having a structure in which an internal conductor is placed in a multi-layer glass body, due to the differences between the thermal expansion coefficients of glass powder, conductor powder, and organic material and the changes that occur when the glass powder and the conductor powder above become a multi-layer glass body and an internal conductor, respectively, internal stress tends to accumulate in the multi-layer glass body formed by the firing. In particular, a large internal stress accumulates near a location where the conductor paste that is positioned at an interface of stacked glass green sheets exist. Therefore, the risk of producing cracks and breaking a wire in such electronic components after the firing is increased, and resistance to additional external force and heat is reduced. In addition, the internal stress may become a cause of distorting the electrical characteristics of electronic components.

Further, in electronic components having a structure in which an internal conductor is placed in a multi-layer glass body, in a manufacturing process, the internal conductor not only needs to be formed on a paste, but also needs to resist high temperatures in the firing. Therefore, the material and the construction method of the internal conductor are selected less freely.

SUMMARY

Therefore, the present disclosure provides a structure that can reduce the influence of firing in an electronic component using glass.

According to a preferred embodiment of the present disclosure, an electronic component includes a single-layer glass plate, an outer-surface conductor that is disposed above an outer surface of the single-layer glass plate and that is at least a part of an electrical element, and a terminal electrode that is a terminal of the electrical element. The terminal electrode is disposed above the outer surface of the single-layer glass plate and being electrically connected to the outer-surface conductor.

In the specification, "single-layer glass plate" is a concept in relation to "multi-layer glass body", and, more specifically, refers to a glass plate in which a conductor integrated inside glass, that is, an internal conductor is not placed in the interior.

"Outer surface of a single-layer glass plate" does not simply mean a surface of the single-layer glass plate facing an outer peripheral side, but refers to any surface of the single-layer glass plate that is a boundary between an outer side portion and an inner side portion of a glass body. "Above the outer surface" does not refer to one absolute direction, such as vertically above defined in a gravitational direction, but any direction towards the outer side portion among the outer side portion and the inner side portion at which the outer surface is a boundary. Consequently, "above the outer surface" is a relative direction that is defined by the orientation of the outer surface. Therefore, "disposed above the outer surface of the single-layer glass plate" means "positioned on the outer side portion of the glass body and not placed in the glass body of the single-layer glass plate".

Since a surface defining a through hole and a surface defining a grooved portion after sintering of the single-layer glass plate is also a surface of the glass body that is a boundary between an outer side portion and an inner side portion of the glass body, such surfaces are also defined as "outer surface of a single-layer glass plate" above. The boundary between the outer side portion and the inner side portion of the glass body above can be easily perceived by analyzing the cross section of the single-layer glass plate by using, for example, a scanning electron microscope (SEM).

"Above" with respect to a certain element not only includes a higher position separated from the certain element, that is, a higher position with another object interposed between the higher position and the certain element or a higher position with an interval between the higher position and the certain element, but also includes a position directly on the certain element with which position the certain element contacts.

In the electronic component of the preferred embodiment, since the outer-surface conductor is disposed on the outer surface of the single-layer glass plate, the outer-surface conductor is not placed in the single-layer glass plate. Therefore, the electronic component above makes it possible to reduce the influence of firing.

Other features, elements, characteristics and advantages of the present disclosure will become more apparent from the following detailed description of preferred embodiments of the present disclosure with reference to the attached drawings.

DETAILED DESCRIPTION

An embodiment of the present disclosure is described below by using the drawings. The drawings are schematic drawings, and the dimensions, the positional relationships, and the shapes of the whole or each portion may be modified or may not be shown.

First Embodiment

Figure 1:
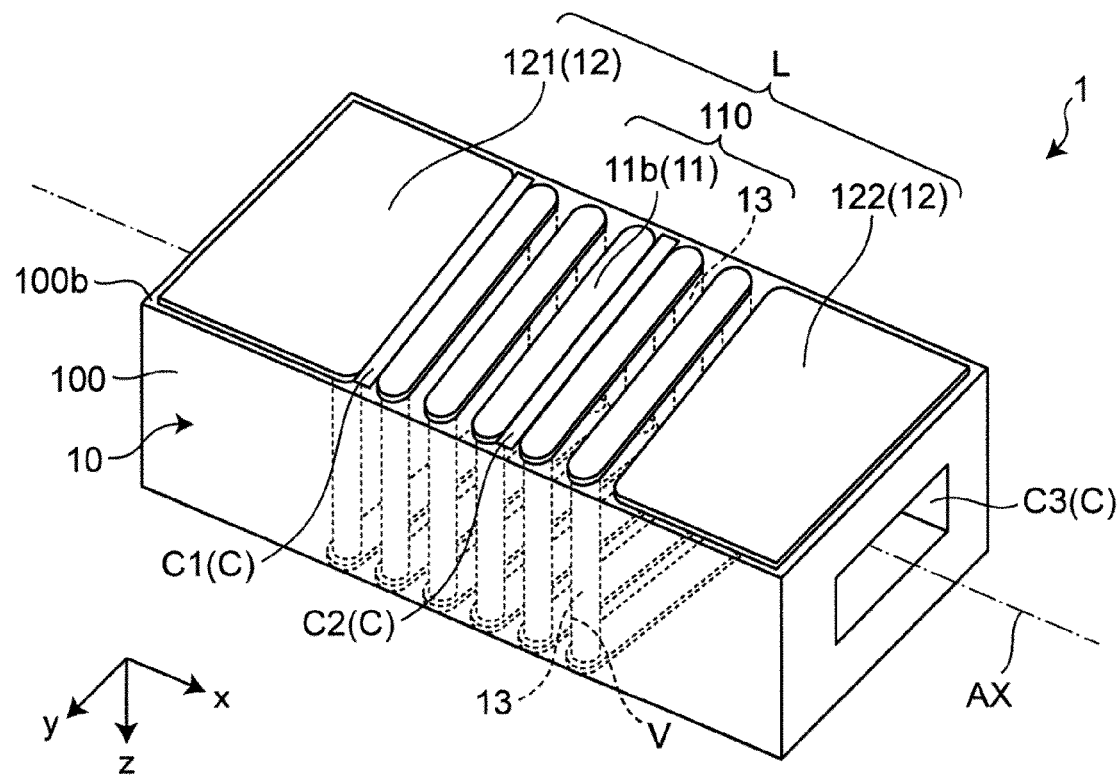
FIG. 1 is a schematic perspective view of an inductor component as viewed from a bottom surface.
Figure 2:
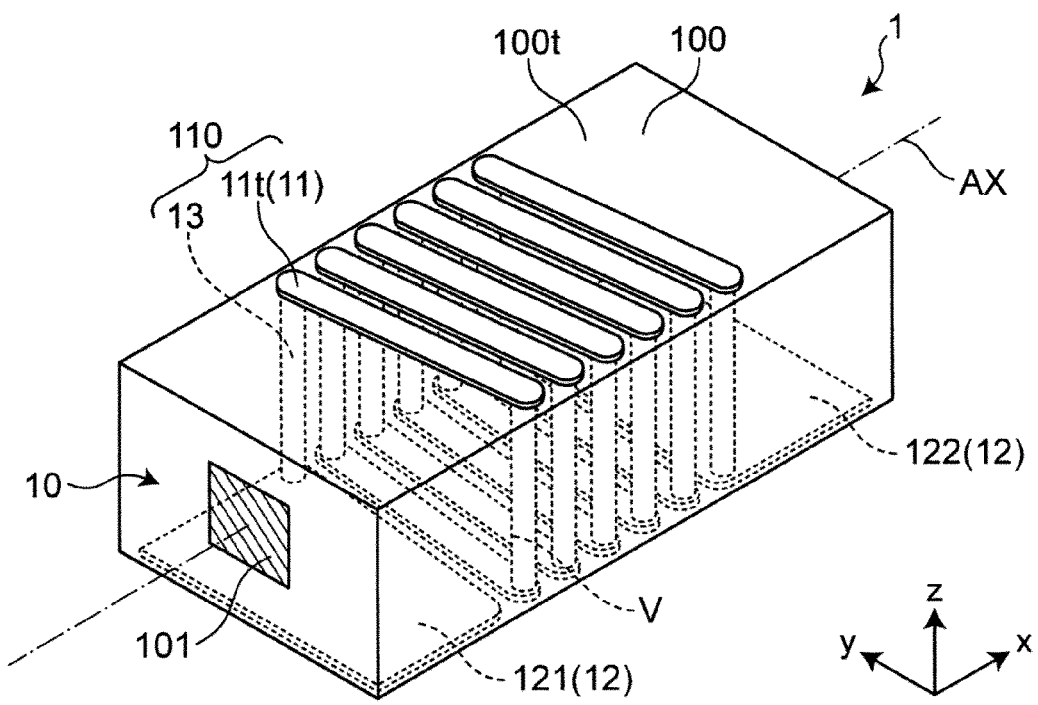
FIG. 2 is a schematic perspective view of the inductor component as viewed from a top surface.

An inductor component 1 according to a first embodiment is described below. FIG. 1 is a schematic perspective view of the inductor component 1 as viewed from a bottom surface. FIG. 2 is a schematic perspective view of the inductor component 1 as viewed from a top surface.

1. General Structure

A general structure of the inductor component 1 is described. The inductor component 1 is a surface-mount-type electronic component that includes, as an electrical element, for example, an inductor element L used in a high-frequency signal transmission circuit. The inductor component 1 includes a single-layer glass plate 10, outer-surface conductors 11 that are each disposed above a corresponding one of outer surfaces 100 of the single-layer glass plate 10 and that are at least part of the inductor element L, and terminal electrodes 12 that are terminals of the inductor element L, the terminal electrodes 12 being disposed above a bottom surface 100b of the single-layer glass plate 10 and being electrically connected to the outer-surface conductors 11.

Due to the structure above, since, in the inductor component 1, the outer-surface conductors 11 and the terminal electrodes 12 are disposed above the corresponding outer surfaces 100 of the single-layer glass plate 10, the outer-surface conductors 11 and the terminal electrodes 12 are not placed in the single-layer glass plate 10. Therefore, the inductor component 1 makes it possible to reduce the influence of firing.

The inductor component 1 further includes through wirings 13 that are at least part of the inductor element L, the through wirings 13 extending through holes V formed in the single-layer glass plate 10 and being electrically connected to the outer-surface conductors 11.

Due to the structure above, in the inductor component 1, it is possible to form wirings in a vertical direction with respect to the outer-surface conductors 11 and the terminal electrodes 12, which are disposed above the corresponding outer surfaces 100, and the inductor element L is formed with greater freedom.

In the inductor component 1, the outer surfaces 100 of the single-layer glass plate 10 include the bottom surface 100b that is one principal surface of the single-layer glass plate 10, and the terminal electrodes 12 include a first terminal electrode 121 and a second terminal electrode 122, which are input/output terminals of the inductor element L. Further, in the inductor component 1, at locations above the bottom surface 100b, the first terminal electrode 121 and the second terminal electrode 122 each have a shape including a principal surface that is parallel to the bottom surface 100b.

Due to the structure above, since the inductor component 1 includes the input/output terminals of the inductor element L, each having a surface that allows solder to adhere in a direction parallel to the bottom surface 100b, on a side of the bottom surface 100b, the inductor component 1 is a surfacemount-type electronic component that allows surface mounting with the bottom surface 100b being a mount surface and that can reduce a mounting area.

In the inductor component 1, the outer surfaces 100 further include a top surface 100t that is positioned on a back side of the bottom surface 100b, and the outer-surface conductors 11 include bottom-surface conductors 11b that are disposed above the bottom surface 100b and top-surface conductors 11t that are disposed above the top surface 100t. The bottom-surface conductors 11b and the top-surface conductors 11t are electrically connected to each other by the through wirings 13. Further, in the inductor component 1, a circularly extending wiring 110 that is formed from the bottom-surface conductors 11b, the top-surface conductors 11t, and the through wirings 13 circularly extends around a winding axis AX that is parallel to the bottom surface 100b.

Due to the structure above, since the winding axis AX is parallel to the mount surface of the inductor component 1, magnetic flux that is a main component of magnetic flux which is generated by the inductor element L and which passes the inside diameter of the circularly extending wiring 110 does not intersect a mounting board, so that it is possible to reduce reduction in a Q value of the inductor element L caused by an eddy current loss and to reduce noise emission with respect to the mounting board.

In the inductor component 1, the single-layer glass plate 10 includes cavities C. Therefore, the effective dielectric constant is lower than that of a single-layer glass plate 10 that does not include cavities C, so that a stray capacitance that is generated between any of the outer-surface conductors 11, any of the terminal electrodes 12, any of the through wirings 13, and a wiring pattern on the mounting board can be reduced, and, in particular, reduction in self-resonant frequency of the inductor element L can be suppressed from occurring.

By performing a processing method (described below), it is possible to form the cavities C in any shape and in any place in the single-layer glass plate 10. For example, the inductor component 1 includes a cavity C1 along a periphery of the terminal electrode 12. In the inductor component 1, the circularly extending wiring 110 circularly extends at least two times around the wiring axis AX, and the single-layer glass plate 10 includes a cavity C2 between adjacent portions of the circularly extending wiring 110. In the inductor component 1, the single-layer glass plate 10 includes a cavity C3 at a location including the winding axis AX.

In this way, at a location of the inductor component 1 where a potential difference is large and lines of electric force tend to be generated, when the cavities C1 to C3 are formed, it is possible to further effectively reduce stray capacitance. The inductor component 1 may include only one or two of the cavities C1 to C3, or may not include the cavities C1 to C3. The cavities C1 to C3 may or may not extend through the single-layer glass plate 10, or may be formed at least near the wirings. For example, the cavities C1 to C3 do not extend through the single-layer glass plate 10. The cavities C1 to C3 may be filled with a magnetic material such as a ferrite plate or a resin containing magnetic powder such as metal magnetic powder or ferrite powder.

Further, as shown in FIG. 2, in the inductor component 1, the single-layer glass plate 10 includes a crystallization portion 101 (shown by hatching). Therefore, by using the crystallization portion 101, it is possible to adjust the effective dielectric constant of the single-layer glass plate 10 and to increase or decrease a stray capacitance that is generated between any of the outer-surface conductors 11, any of the terminal electrodes 12, any of the through wirings 13, and the wiring pattern on the mounting board, in particular, to adjust the self-resonant frequency of the inductor element L.

In FIG. 2, although, in the inductor component 1, the single-layer glass plate 10 includes the crystallization portion 101 at a location including the winding axis AX, the location of the crystallization portion 101 is not limited thereto. The locations of the cavities C1 to C3 and the location of the crystallization portion 101 may be transposed. The single-layer glass plate 10 may include only the cavities C or only the crystallization portion 101, or may include neither of them. When, as in the inductor component 1, the cavity C3 and the crystallization portion 101 are both situated at locations including the winding axis AX, the depth of the cavity C3 and the depth of the crystallization portion 101 may be the same or may differ, and the cavity C1 and the crystallization portion 101 may be adjacent to each other or may be disposed apart from each other.

Figure 3:
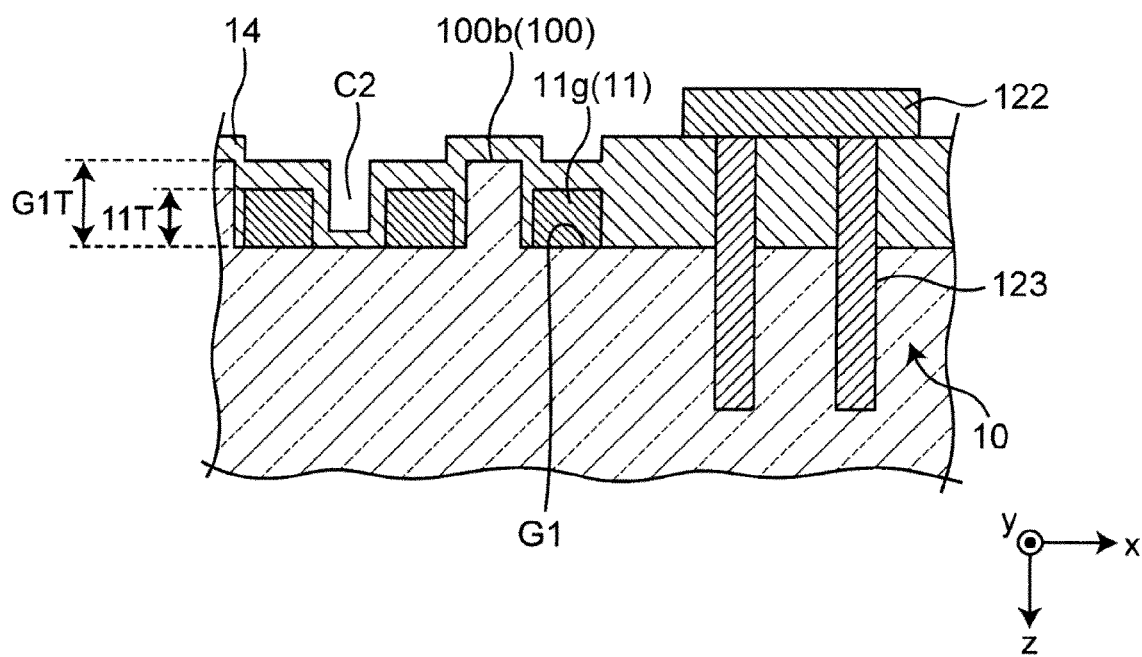
FIG. 3 is a schematic sectional view of the inductor component.
Figure 4:
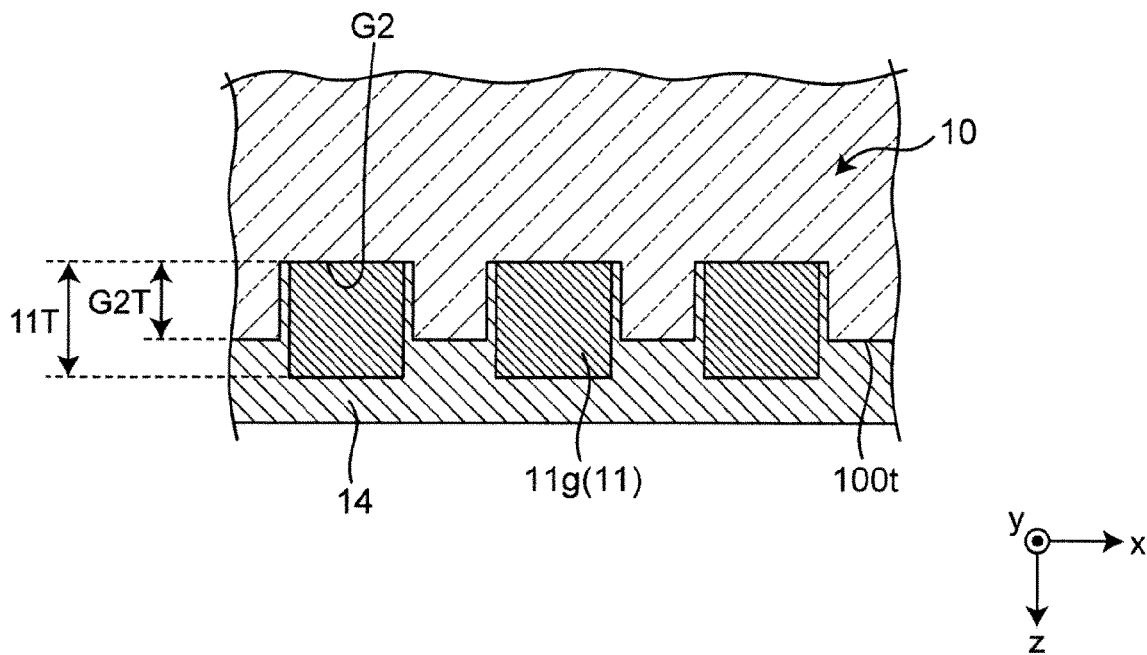
FIG. 4 is a schematic sectional view of the inductor component.

Next, the cross-sectional shape of the inductor component 1 is described. FIGS. 3 and 4 are each a schematic sectional view of the inductor component 1. Specifically, the cross section of FIG. 3 is a cross section of a portion in enlarged form near the bottom surface 100b on a side of the second terminal electrode 122 in a cross section including the winding axis AX and orthogonal to the bottom surface 100b. The cross section of FIG. 4 is a cross section of a portion in enlarged form near the top surface 100t in a cross section including the winding axis AX and orthogonal to the top surface 100t.

As shown in FIGS. 3 and 4, in the inductor component 1, the bottom surface 100b and the top surface 100t, which are the outer surfaces 100 of the single-layer glass plate 10, each have grooved portions G1 or grooved portions G2 that are each recessed with respect to a vicinity; and the outer-surface conductors 11 include grooved-portion conductors 11g that are each disposed in a corresponding one of the grooved portions G1 and G2.

In the structure above, since the range of formation of the grooved-portion conductors 11g is restricted by the grooved portions G1 and G2, the grooved-portion conductors 11g are formed with high precision. Therefore, in the inductor component 1, further, the precision of the shape and characteristics of the inductor element L is increased. Since the terminal electrodes 12 more easily protrude than the grooved-portion conductors 11g towards the side of the bottom surface 100b, solder is unlikely to adhere to the grooved-portion conductors 11g when mounting the inductor component 1 onto the mounting board, so that the mountability of the inductor component 1 is increased.

At this time, it is more desirable that portions of the single-layer glass plate 10 be disposed between adjacent grooved-portion conductors 11g, so that the insulation property and the electrochemical migration resistance between the adjacent grooved-portion conductors 11g with the portions of the single-layer glass plate 10 interposed therebetween are further increased. In this case, compared to the case in which the portions of the single-layer glass plate 10 are not interposed, it is possible to further reduce the interval between the grooved-portion conductors 11g, and the efficiency with which the inductance value (L value) with respect to the external shape of the inductor component 1 is obtained is increased.

As shown in FIG. 3, on the side of the bottom surface 100b of the inductor component 1, thickness 11T of each grooved-portion conductor 11g is less than depth G1T of each grooved portion G1. Therefore, since the grooved-portion conductors 11g do not protrude from the single-layer glass plate 10, the grooved-portion conductors 11g are unlikely to become damaged when, for example, manufacturing or mounting the inductor component 1.

As shown in FIG. 3, it is desirable that the inductor component 1 include a protective film 14 that covers the outer-surface conductors 11 (the grooved-portion conductors 11g). This makes it possible to suppress damage to the outer-surface conductors 11 from occurring. Further, in the inductor component 1, since the thickness 11T of each grooved-portion conductor 11g is less than the depth G1T of each grooved portion G1, the protective film 14 can be made thin. This means that, in the height dimension of the inductor component 1, the proportion that the protective film 14 occupies can be reduced. In this case, since the inside diameter of the circular shape of the circularly extending wiring 110 can be further increased, the efficiency with which the L value and the Q value per external shape of the inductor component 1 are obtained is increased.

The protective film 14 is not a required structure. The inductor component 1 may not include the protective film 14, or only a part of the inductor component 1 may include the protective film 14. For example, in particular, it is desirable that the protective film 14 cover the outer-surface conductors 11 and that the terminal electrodes 12 be exposed. Although similarly not required, by covering the single-layer glass plate 10 with the protective film 14, it is possible to reduce damage to the single-layer glass plate 10 from occurring.

As shown in FIG. 4, on a side of the top surface 100t of the inductor component 1, thickness 11T of each grooved-portion conductor 11g is greater than depth G2T of each grooved portion G2. Therefore, when the height dimension of the inductor component 1 has been prescribed, compared to outer-surface conductors 11 disposed on the top surface 100t instead of in the grooved portions G2, the thickness 11T of each grooved-portion conductor 11g can be increased and the direct current resistance of each grooved-portion conductor 11g can be reduced. Therefore, the efficiency with which the Q value per external shape of the inductor component 1 is obtained is increased. By increasing the thickness 11T, since the thermal capacity of each grooved-portion conductor 11g is also increased, the heat dissipation characteristics of the inductor element L are also improved.

Although, in the description above, the bottom surface 100b and the top surface 100t of the inductor component 1 include the corresponding grooved portions G1 and G2 having the corresponding depths G1T and G2T whose relationships with the corresponding thicknesses 11T of the grooved-portion conductors 11g differ from each other, the inductor component 1 is not limited to such a structure. For example, each grooved portion G1 may be formed in the top surface 100t, each grooved portion G2 may be formed on the side of the bottom surface 100b, only the grooved portions G1 or the grooved portions G2 may be formed in one or both of the bottom surface 100b and the top surface 100t.

Figure 5:
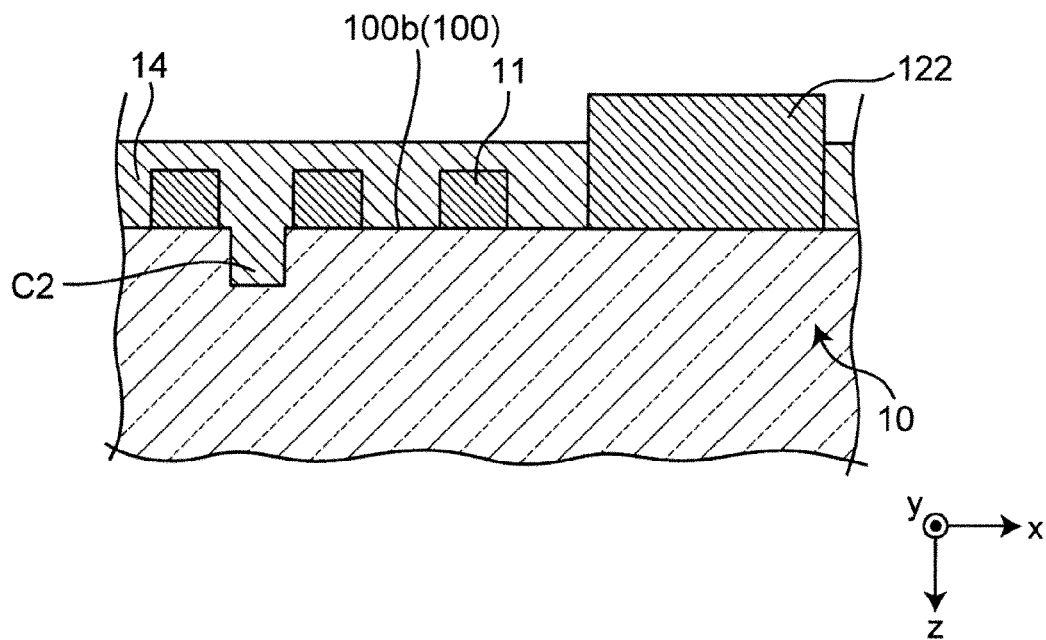
FIG. 5 is a schematic sectional view of the inductor component.

The grooved portions G1 and G2 are not required structures of the inductor component 1. FIG. 5 is a schematic sectional view of the inductor component 1 and shows a cross section corresponding to the cross section of FIG. 3. As shown in FIG. 5, the outer-surface conductors 11 need not include grooved-portion conductors 11g. A structure including grooved portions G1 for circular extensions of respective outer-surface conductors 11, a structure including grooved portions G2 for circular extensions of respective outer-surface conductors 11, or a structure not including grooved portions may be provided.

As shown in FIG. 3, the inductor component 1 further includes anchor sections 123 that protrude into the single-layer glass plate 10 from the second terminal electrode 122. Although not shown, a side of the first terminal electrode 121 also has a similar structure. Therefore, the fixing strength of the terminal electrodes 12 with respect to the single-layer glass plate 10 is increased. In FIG. 3, although the anchor sections 123 protrude up to an intermediate position of the single-layer glass plate 10 from the bottom surface 100b, the anchor sections 123 may protrude up to the top surface 100t and extend through the single-layer glass plate 10.

Although the anchor sections 123 are formed in holes formed in the single-layer glass plate 10, it is desirable that the anchor sections 123 fill the entire holes to further increase the fixing strength of the terminal electrodes 12 with respect to the single-layer glass plate 10.

The anchor sections 123 are not required structures of the inductor component 1. Anchor sections 123 need not be provided, or anchor sections 123 may be provided at only one of the side of the first terminal electrode 121 and the side of the second terminal electrode 122. Further, in FIG. 3, although two anchor sections 123 protrude from the second terminal electrode 122, the number of anchor sections 123 is not limited thereto, and may be one or three or more.

As illustrated in the drawings, for explanatory convenience, hereunder, a direction that is a longitudinal direction of the single-layer glass plate 10 and that goes toward the second terminal electrode 122 from the first terminal electrode 121 is defined as an x direction. Of directions that are orthogonal to the x direction, the direction that goes toward the top surface 100t from the bottom surface 100b is defined as a z direction, and the direction that is orthogonal to the x direction and the z direction and that defines a right hand system when x, y, and z are arranged in this order is defined as a y direction. When, for example, orientations are not considered, directions that are parallel to the respective x, y, and z directions may be indicated as respective L direction, W direction, and T direction.

Due to the definitions above, above the bottom surface 100b, which is an outer surface 100, refers to a direction that goes opposite to the z direction from the bottom surface 100b; and above the top surface 100t, which is an outer surface 100, refers to a direction that goes towards the z direction from the top surface 100t. The thickness of each outer-surface conductor 11, which includes, for example, each grooved-portion conductor 11g, is a thickness in a direction that is orthogonal to the outer surface 100 that is positioned below the outer-surface conductors 11. For example, in FIGS. 3 and 4, the thickness of each grooved-portion conductor 11g is a thickness of each conductor in the T direction.

2. Structure of Each Portion

Single-Layer Glass Plate 10

The single-layer glass plate 10 functions as an insulator and a structural body of the inductor component 1. From the viewpoint of manufacturing methods (described below), it is desirable that the single-layer glass plate 10 be made of a photosensitive glass plate, a typical example thereof being Foturan II (registered trademark of Schott AG). In particular, it is desirable that the single-layer glass plate 10 contain cerium oxide (ceria: $CeO_2$), in which case the cerium oxide becomes a sensitizing agent, and processing by photolithography is further facilitated.

However, the single-layer glass plate 10 can be processed by, for example, machining, such as drilling or sandblasting; dry/wet etching using, for example, a photoresist/metal mask; or laser processing. Therefore, a glass plate that is not photosensitive may be used. The single-layer glass plate 10 may be one in which glass paste has been sintered, or may be formed by a publicly known method, such as a float method.

The single-layer glass plate 10 is a single-layer plate member in which wirings, such as internal conductors integrated with the inside of a glass body, are not placed in the glass body. In particular, the single-layer glass plate 10 includes the outer surfaces 100 as the boundaries between the outer side portion and the inner side portion of the glass body. Since the through holes V, the grooved portions G1, and the grooved portions G2, formed in the single-layer glass plate 10, are also boundaries between the outer side portion and the inner side portion of the glass body, they are defined as the outer surfaces 100.

Although the single-layer glass plate 10 is basically in an amorphous state, the single-layer glass plate 10 may include the crystallization portion 101. For example, when Foturan II above is used, although the dielectric constant of amorphous glass is 6.4, the dielectric constant can be reduced to 5.8 by crystallization. Therefore, it is possible to reduce the parasitic capacitance between conductors near the crystallization portion 101.

Outer-Surface Conductors 11

The outer-surface conductors 11 are wirings disposed above the corresponding one of the outer surfaces 100 of the single-layer glass plate 10, that is, on the outer side portion of the single-layer glass plate 10, and constitute at least part of the inductor element L, which is an electrical element. More specifically, the outer-surface conductors 11 include the bottom-surface conductors 11b that are disposed on the bottom surface 100b of the single-layer glass plate 10 and the top-surface conductors 11t that are disposed on the top surface 100t of the single-layer glass plate 10. Each bottom-surface conductor 11b has a shape extending in the W direction and each top-surface conductor 11t extends in the W direction while being slightly tilted in the L direction. Therefore, the circularly extending wiring 110 has a substantially helical shape in which a change-over to a next spiral occurs at each top-surface conductor 11t.

The outer-surface conductors 11 are made of conductive materials having high conductivity, such as copper, silver, gold, or an alloy thereof. The outer-surface conductors 11 may be metal films formed by, for example, plating, evaporation, or sputtering, or may be a metal sintered body in which a conductor paste has been applied and sintered. The outer-surface conductors 11 may have a multi-layer structure including a plurality of metal layers that are stacked upon each other, or may be one in which, for example, when a protective film 14 is not included, a film made of nickel, tin, gold, or the like is formed at an outermost layer. It is desirable that the thickness of the outer-surface conductors 11 be 5 μm or more and 50 μm or less (i.e., from 5 μm to 50 μm).

It is desirable that the outer-surface conductors 11 be formed by a semi-additive method. This makes it possible to form the outer-surface conductors 11 having low electrical resistance, high precision, and high aspect. For example, the outer-surface conductors 11 can be formed as follows. First, a titanium layer and a copper layer are formed in this order by performing a sputtering method or electroless plating on the entire outer surfaces 100 of each single-layer glass plate 10 after division into individual pieces to form a seed layer, and a patterned photoresist is formed on the seed layer. Next, a copper layer is formed by electroplating on the seed layer at a cavity portion of the photoresist. Thereafter, the photoresist and the seed layer are removed by wet etching or dry etching. Therefore, the outer-surface conductors 11 that have been patterned to any shape can be formed on the outer surfaces 100 of each single-layer glass plate 10.

Terminal Electrodes 12

The terminal electrodes 12 are terminals of the inductor element L and are disposed above the outer surface 100 of the single-layer glass plates 10 and are electrically connected to the outer-surface conductors 11. As shown in FIG. 2, the terminal electrodes 12 are exposed to the outside of the inductor component 1. More specifically, the terminal electrodes 12 include the first terminal electrode 121 and the second terminal electrode 122 that are disposed on the bottom surface 100b of the single-layer glass plate 10, and the first terminal electrode 121 and the second terminal electrode 122 are exposed to the outside only at the bottom surface 100b.

However, the terminal electrodes 12 are not limited to the structure above. The number of terminal electrodes 12 may be three or more, and the terminal electrodes 12 may also be formed on a side surface adjacent to the bottom surface 100b, or on the top surface 100t. The terminal electrodes 12 can be formed by using any of the materials and manufacturing methods exemplified for the outer-surface conductors 11.

For example, as shown in FIG. 3, by forming the terminal electrodes 12 on the outer surface 100 of the single-layer glass plate 10 at locations above the outer-surface conductors 11, the terminal electrodes 12 may protrude above the outer-surface conductors 11. For example, as shown in FIG. 4, the terminal electrodes 12 may protrude above the outer-surface conductors 11 by making the terminal electrodes 12 thicker than the outer-surface conductors 11. When the outer-surface conductors 11 are covered with the protective film 14, the terminal electrodes 12 need not protrude from the protective film 14. A principal surface of each terminal electrode 12 may be positioned closer than the protective film 14 to a side of the single-layer glass plate 10. In this case, mountability may be increased by forming a solder ball on the principal surface of each terminal electrode 12.

Although the inductor component 1 includes the anchor sections 123 that protrude into the single-layer glass plate 10 from the terminal electrodes 12, the anchor sections 123 may be formed by, for example, a method in which, prior to forming the terminal electrodes 12, non-through holes or through holes are formed by performing a processing method (described later) on the single-layer glass plate 10, and conductors are formed in the non-through holes or the through holes by using any of the materials and manufacturing methods exemplified for the outer-surface conductors 11. For example, a seed layer may be formed in the non-through holes or the through holes and in a terminal electrode formation region in the vicinity thereof to form conductors that are caused to fill the non-through holes or the through holes by performing electroplating. The terminal electrodes 12 and the anchor sections 123 may be separately formed, or may be formed using the same seed layer to integrally form the terminal electrodes 12 and the anchor sections 123, so that the terminal electrodes 12 are those subjected to high anchoring effect.

Through Wirings 13

The through wirings 13 are wirings that extend through the corresponding through holes V formed in the single-layer glass plate 10 and that are electrically connected to the corresponding outer-surface conductors 11, and constitute at least part of the inductor element L. In particular, the circularly extending wiring 110 including the outer-surface conductors 11 and the through wirings 13 has a substantially helical shape circularly extending around the winding axis AX and constitutes the main portion of the inductor element L. By performing a method (described below), the through wirings 13 can be formed in the through holes V previously formed in the single-layer glass plate 10 by using any of the materials and manufacturing methods exemplified for the outer-surface conductors 11.

In FIGS. 1 and 2, although the through wirings 13 are formed in the through holes V formed in a direction orthogonal to the bottom surface 100$b$ and the top surface 100$t$, it is not limited thereto. For example, in each single-layer glass plate 10 after the division into individual pieces, the through holes V may be formed in a direction parallel to the bottom surface 100$b$ and the top surface 100$t$ to form wirings that extend in the direction parallel to the bottom surface 100$b$ and the top surface 100$t$.

Protective Film 14

The protective film 14 is a member that has the role of preventing damage to the outer-surface conductors 11 from occurring by protecting the outer-surface conductors 11 from external forces, and the role of increasing the insulation property of the outer-surface conductors 11. It is desirable that the protective film 14 be, for example, an inorganic film made of an oxide, a nitride, or an oxynitride of, for example, silicon or hafnium, having excellent insulation property and capable of easily being made thin. However, the protective film 14 may be a resin film made of, for example, epoxy or polyimide that allows easier formation thereof.

As shown in FIG. 4, the protective film 14 may cover the single-layer glass plate 10 and the outer-surface conductors 11 (the grooved-portion conductors 11$g$) on the top surface 100$t$. This makes it possible to form a pickup surface of a mounting device when mounting the inductor component 1 onto the mounting board.

3. Processing Method of Single-Layer Glass Plate 10

In the inductor component 1, prior to forming the inductor element L including, for example, the outer-surface conductors 11, the terminal electrodes 12, and the through wirings 13, the single-layer glass plate 10 is a processing body including previously formed through holes V, previously formed cavities C, a previously formed crystallization portion 101, previously formed grooved portions G1 and G2, etc. In processing the single-layer glass plate 10, although it is possible to use publicly known methods including the above-described methods, it is most desirable to perform the processing using photosensitive glass, thereby allowing the processing to be performed with high precision. The processing method using photosensitive glass is described below.

(1) Preparation of Board

First, a photosensitive glass board, which is an assembly of portions that become the single-layer glass plates 10, is prepared. For the photosensitive glass board, for example, Foturan II can be used. In general, the photosensitive glass board contains an oxide of silicon, lithium, aluminum, cerium, or the like to allow photolithography with high precision.

(2) Exposure

Next, portions of the prepared photosensitive glass board where, for example, the through holes V, the cavities C, the crystallization portion 101, and the grooved portions G1 and G2 are to be formed are irradiated with, for example, ultraviolet light having a wavelength of approximately 310 nm. The irradiation with ultraviolet light causes, for example, metal ions, such as cerium ions, in the photosensitive glass to be oxidized by light energy to discharge electrons. Here, the final processing depth of the single-layer glass plates 10 can be controlled by adjusting the irradiation amount of ultraviolet light in accordance with the thickness of the photosensitive glass board. For example, by setting the irradiation amount to a large amount, it is possible to form the through holes V that extend up to the top surface 100$t$ from the bottom surface 100$b$ of each single-layer glass plate 10, whereas, by adjusting the irradiation amount to a small amount, it is possible to form the non-through holes, such as the cavities C and the grooved portions G1 and G2.

As an exposure device used in irradiating the photosensitive glass board with ultraviolet light, a contact aligner or a stepper that allows ultraviolet light having a wavelength of approximately 310 nm to be obtained can be used. Alternatively, a laser irradiation device including a femtosecond laser can be used as a light source. When a femtosecond laser is used, by condensing laser light in an internal portion of the photosensitive glass board, it is possible to discharge electrons from metal oxide only at a light-condensing portion. That is, it is possible to photosensitize only the internal portion without photosensitizing a surface of a laser-light irradiation portion of the photosensitive glass board.

Therefore, each single-layer glass plate 10 is designed with greater freedom. For example, as with the locations where the cavity C3 and the crystallization portion 101 of the inductor component 1 are formed, inner portions that are not exposed at the bottom surface 100$b$ and the top surface 100$t$, which are surfaces where the outer-surface conductors 11 are formed, that is, portions of the photosensitive glass board other than the exposed surfaces can be processed.

(3) Firing

The photosensitive glass board after the exposure above is fired. Specifically, the photosensitive glass board is fired at temperatures in two stages, for example, first, at a temperature near 500° C. Therefore, in the ultraviolet-light irradiation portion of the photosensitive glass board, ions, such as silver ions, gold ions, or copper ions, are reduced by discharged electrons to form a nano-cluster of metal atoms. Next, the photosensitive glass board is fired at a temperature near 560° C. Therefore, the nano-cluster of metal atoms becomes a crystalline nucleus and a crystal phase of, for example, lithium metasilicate is deposited in the vicinity of the crystalline nucleus. The crystal phase of, for example, lithium metasilicate easily dissolves in hydrofluoric acid, and this characteristic is used in the next etching step.

In uniformly depositing the crystal phase above in a plane of the photosensitive glass board, the temperature distribution inside a firing furnace needs to be uniform and is desirably within ±3° C.

(4) Etching

After the firing, the etching step using a hydrofluoric acid aqueous solution is performed. It is desirable that the concentration of hydrofluoric acid aqueous solution be, for example, 5 to 10%. In the etching step, the entire photosensitive glass board after the firing above is immersed in the hydrofluoric acid aqueous solution. Therefore, only the crystal phase inside the board is etched and the through holes or the non-through holes are formed. For the purpose of smoothening the surface of the etched photosensitive glass board, the hydrofluoric acid aqueous solution may contain an acid other than hydrofluoric acid, such as hydrochloric acid or nitric acid.

When the crystallization portion 101 is to be formed in each single-layer glass plate 10, for example, a portion of the crystal phase that becomes the crystallization portion 101 may be covered with a barrier layer that is resistant to a hydrofluoric acid aqueous solution to prevent the hydrofluoric acid aqueous solution from being immersed in the crystal phase. After the step above, if necessary, the thickness of the photosensitive glass board may be adjusted by grinding the photosensitive glass board.

(5) Formation of Conductors

For example, the outer-surface conductors 11, the terminal electrodes 12, and the through wirings 13 are formed at the corresponding outer surfaces of the photosensitive glass board after the etching step above by, for example, a semi-additive method. The outer-surface conductors 11, the terminal electrodes 12, and the through wirings 13 may be formed from a single seed layer, or may be formed by separate steps. When the thickness of the outer-surface conductors 11 and the thickness of the terminal electrodes 12 are to be different, for example, while covering the outer-surface conductors 11 with the protective film 14, only portions that become the terminal electrodes 12 may be further subjected to electroplating, or a seed layer may be formed again to form a multi-layered conductor layer.

After forming the conductors, if necessary, the conductors are coated with or laminated with a resin to form the protective film 14, and the photosensitive glass board is divided into individual pieces by, for example, using a dicing blade, so that an inductor component 1 including the single-layer glass plates 10 is completed.

In the manufacturing method above, since after sintering each single-layer glass plate 10 of the inductor component 1, the conductors, such as the outer-surface conductors 11, the terminal electrodes 12, and the through wirings 13 are formed, it is possible to reduce the influence caused by the firing.

In the above, although, in the etching step, the crystallization portion 101 is formed by covering a portion of the crystal phase with a barrier layer that is resistant to a hydrofluoric acid aqueous solution, it is not limited thereto. For example, it is possible to, by irradiating with ultraviolet light again the photosensitive glass board after the formation of conductors or the inductor component 1 after the division into pieces, slightly crystalize the irradiation portion and form the crystallization portion 101. This causes the crystallization portion 101 to be formed with greater freedom.

4. Modifications

Although, as the first embodiment, the inductor component 1 has been described, the inductor component 1 may have additional structures below that have not been described above.

Low Transmittance Portion 102

Figure 6:
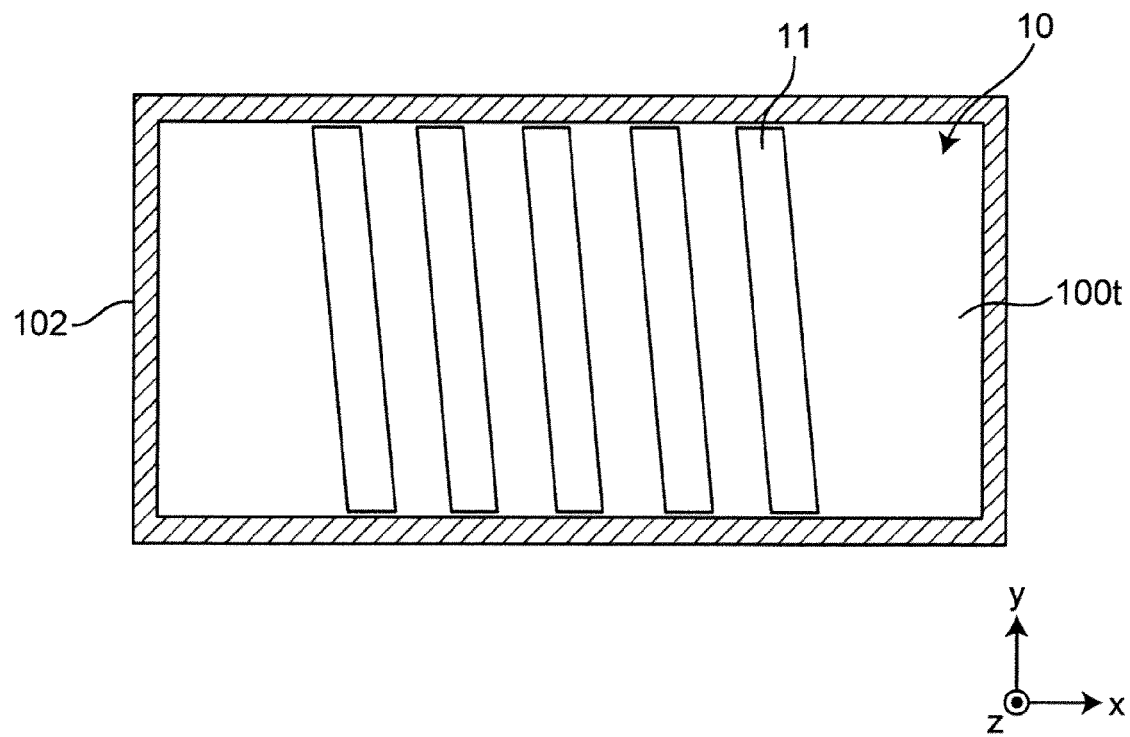
FIG. 6 is a schematic top view of the inductor component.
Figure 7:
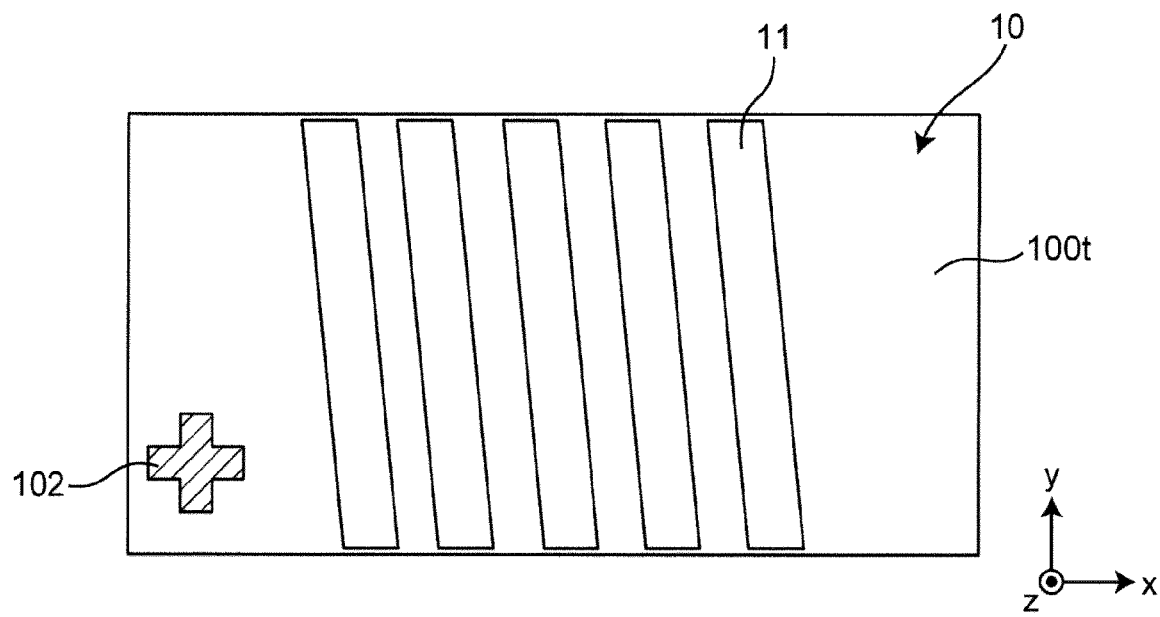
FIG. 7 is a schematic top view of the inductor component.
Figure 8:
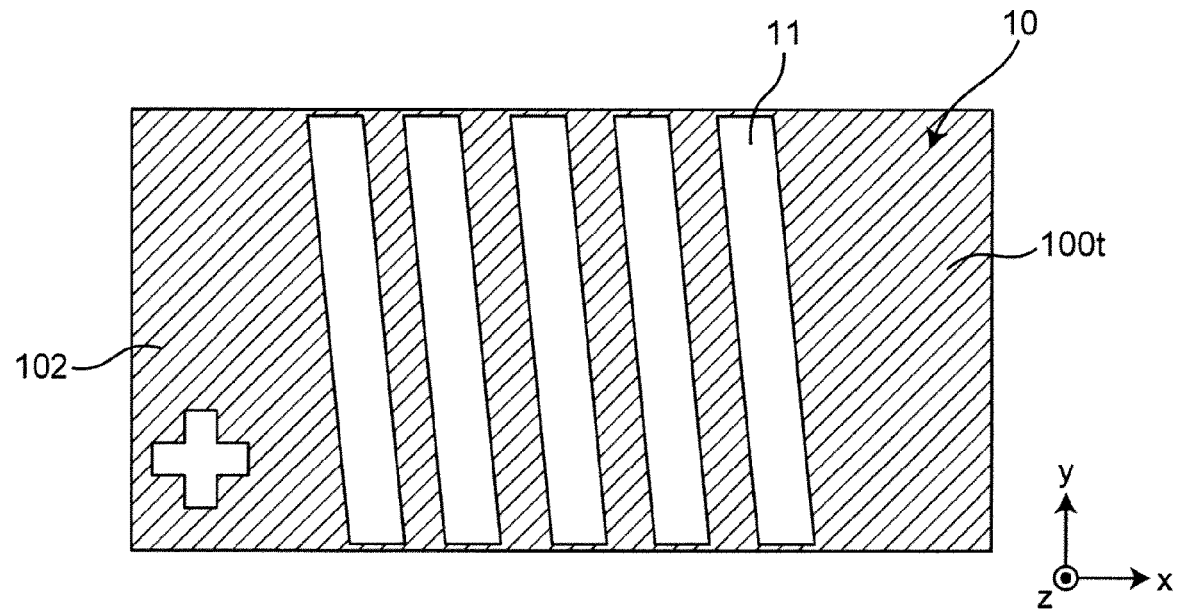
FIG. 8 is a schematic top view of the inductor component.

FIGS. 6, 7, and 8 are each a schematic top view of the inductor component 1. The inductor component 1 includes a low transmittance portion 102 (shown by hatching) on at least a part of an outer surface 100 of the single-layer glass plate 10, the low transmittance portion 102 having a light transmittance that is lower than that of the vicinity thereof. Therefore, the single-layer glass plate 10 having high light transmittance and low visibility has improved visibility and is easy to handle when manufacturing and using the inductor component 1. The low transmittance portion 102 has a light transmittance that is lower than that of the vicinity thereof with regard to at least some of the wavelengths, and has low light transmittance with regard to, for example, a wavelength of infrared light, visible light, or ultraviolet light, or a plurality of such wavelengths.

The low transmittance portion 102 can be formed, for example, by using a photosensitive glass for the single-layer glass plate 10 and, similarly to the crystallization portion 101 above, partly crystalizing the single-layer glass plate 10. The transmittance of the low light-transmission portion 102 can be controlled as appropriate on the basis of, for example, the irradiation amount/irradiation time of ultraviolet light or heating.

As shown in FIG. 6, it is desirable that the low transmittance portion 102 be positioned on an outer peripheral edge of one surface of the outer surfaces 100 of the single-layer glass plate 10, such as of the top surface 100t in FIG. 6. This makes it possible to, regarding the one surface, easily perceive the outer peripheral edge, in particular, more easily examine the outer appearance at the time of manufacture or use.

As shown in FIG. 7, it is desirable that the low transmittance portion 102 have a cross-shape on one surface of the outer surfaces 100 of the single-layer glass plate 10, for example, on the top surface 100t in FIG. 7. This makes it possible to, regarding the one surface, use the cross shape as an alignment mark in, for example, photolithography and to increase processing precision. The cross shape can also be used as a directional mark indicating the polarities of the inductor component 1.

As shown in FIG. 8, the low transmittance portion 102 may be formed on one entire surface of the outer surfaces 100 of the single-layer glass plate 10, for example, on the entire top surface 100t in FIG. 8. This makes it possible to, by not allowing the bottom-surface conductors 11b and the terminal electrodes 12 to be perceived from the opposite side, for example, from the bottom surface 100b, increase the precision with which anything is perceived from the top surface 100t. Here, it is possible to, by causing the amorphous portion of the single-layer glass plate 10 to partly remain, such as at the cross shape, provide an alignment mark or a directional mark, as that shown in FIG. 7.

Underlying Insulation Layer 15

Figure 9:
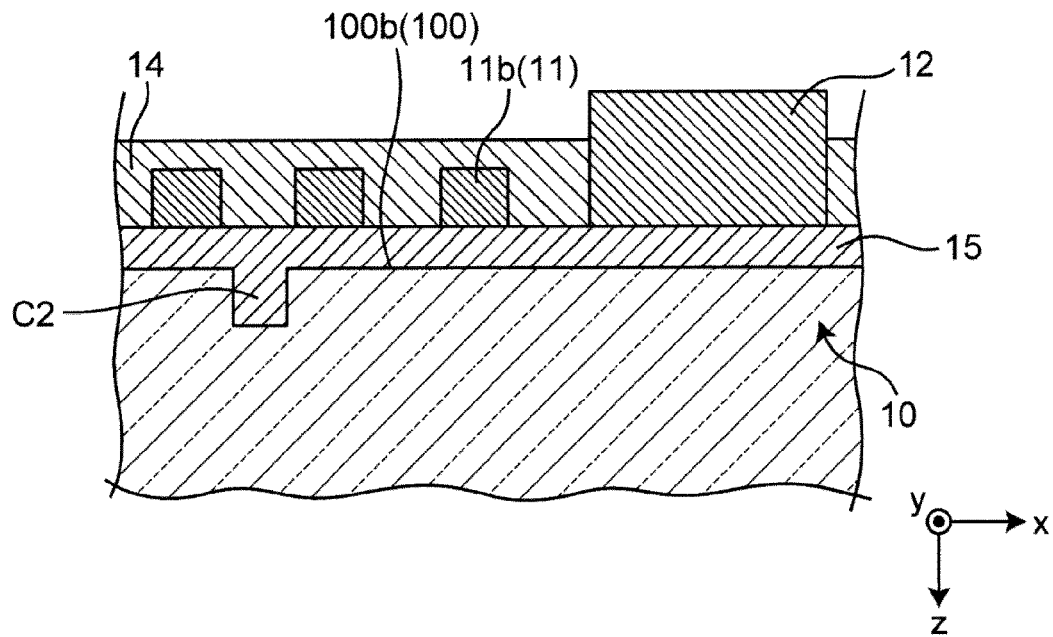
FIG. 9 is a schematic sectional view of the inductor component.

FIG. 9 is a schematic sectional view of the inductor component 1 and shows locations corresponding to those shown in FIG. 3. As shown in FIG. 9, the inductor component 1 may further include an underlying insulation layer 15 disposed on an outer surface 100 of the single-layer glass plate 10, or the bottom surface 100b in FIG. 9, and the terminal electrodes 12 may be disposed on the underlying insulation layer 15. At this time, the outer-surface conductors 11 may also be disposed on the underlying insulation layer 15. In this way, the outer-surface conductors 11 and the terminal electrodes 12 may be disposed not only directly on the outer surface 100 of the single-layer glass plate 10, but also above the outer surface 100 with a different member (the underlying insulation layer 15) interposed therebetween.

By using the underlying insulation layer 15, it is possible to adjust, for example, the heights of formation and the degree of close contact of the outer-surface conductors 11 and the terminal electrodes 12, and the electrical characteristics of the inductor element L.

The underlying insulation layer 15 can be formed by, for example, in the above-described manufacturing method, laminating the photosensitive glass board before forming a seed layer with a resin film, such as ABF GX-92 (manufactured by Ajinomoto Fine-Techno Co., Inc.), or applying, subjecting to thermosetting, etc. a paste-like resin with respect to the photosensitive glass board before forming a seed layer.

Figure 10:
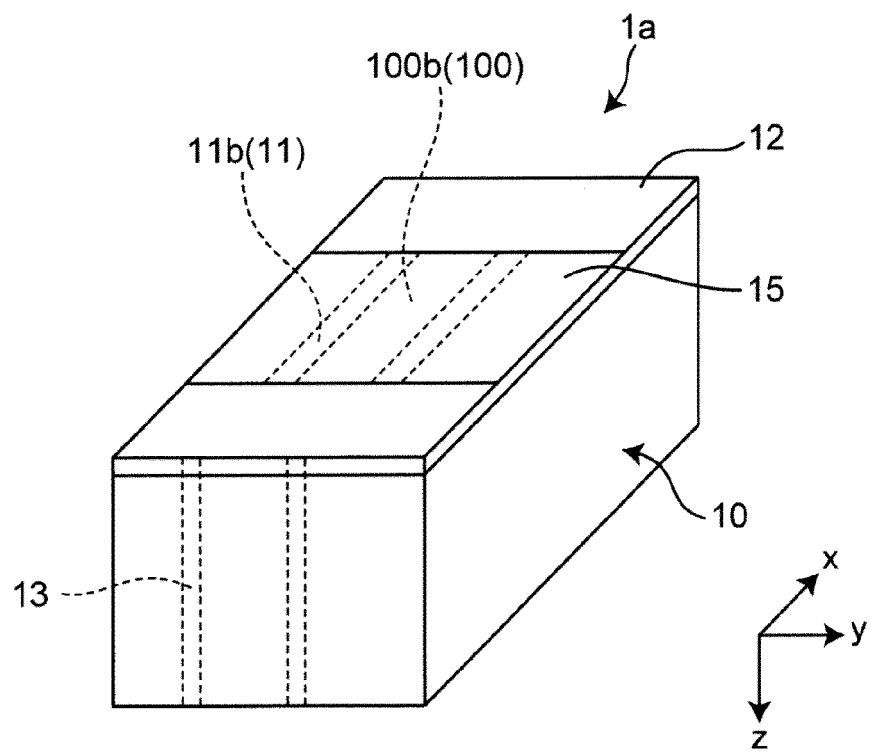
FIG. 10 is a schematic perspective view of an inductor component as viewed from a bottom surface.
Figure 11:
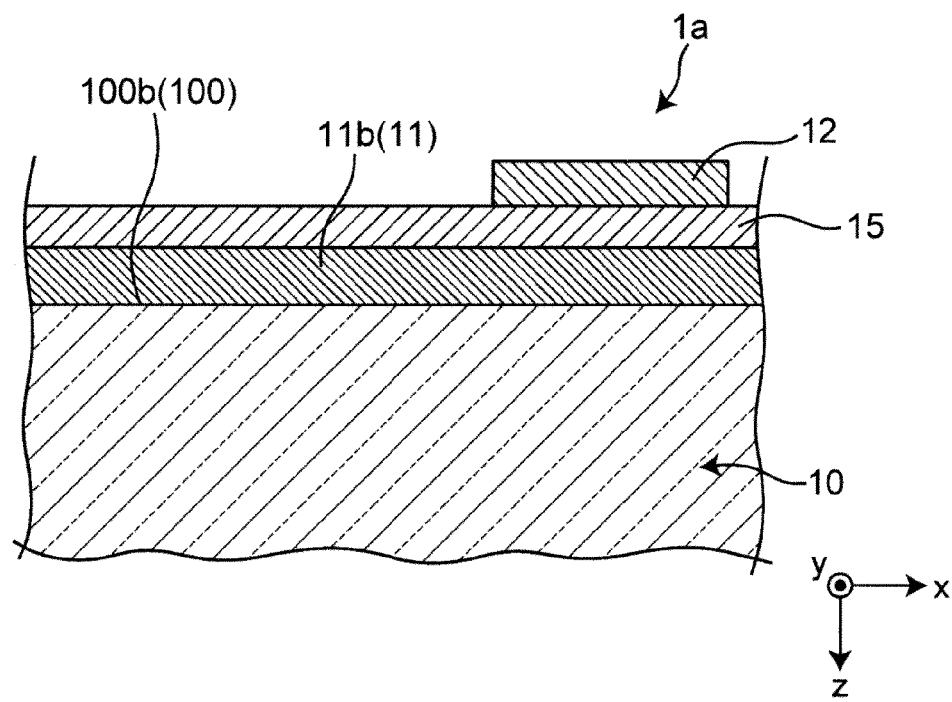
FIG. 11 is a schematic sectional view of the inductor component.

The underlying insulation layer 15 may be disposed on the outer-surface conductors 11. FIG. 10 is a schematic perspective view of an inductor component 1a according to the modification as viewed from a bottom surface. FIG. 11 is a schematic sectional view of the inductor component 1a. FIG. 11 shows locations corresponding to those shown in FIG. 3.

In the inductor component 1a, bottom-surface conductors 11b extend in an L direction on the bottom surface 100b, which is an outer surface 100 of the single-layer glass plate 10, the underlying insulation layer 15 is disposed on the bottom-surface conductors 11b, and the terminal electrodes 12 are disposed on the underlying insulation layer 15. In this way, by forming the outer-surface conductors 11 and the terminal electrodes 12 in different layers, it is possible to design a layout of the outer-surface conductors 11 and the terminal electrodes 12 with greater freedom. In particular, as in the inductor component 1a, by forming the outer-surface conductors 11 in a longitudinal direction of the single-layer glass plate 10, the inside diameter of the circularly extending wiring is increased, so that the efficiency with which the L value and the Q value of the inductor element L with respect to the external shape of the inductor component 1a are obtained is increased.

By forming through wirings (not shown) formed in the underlying insulation layer 15, the terminal electrodes 12 can be electrically connected to the bottom-surface conductors 11b and the through wirings 13. Instead of disposing only the terminal electrodes 12 on the underlying insulation layer 15, as a re-wiring layer, a wiring that is electrically connected to the bottom-surface conductors 11b and the through wirings 13 may be disposed at the underlying insulation layer 15. This allows the inductor element L to be designed with greater freedom.

Figure 12:
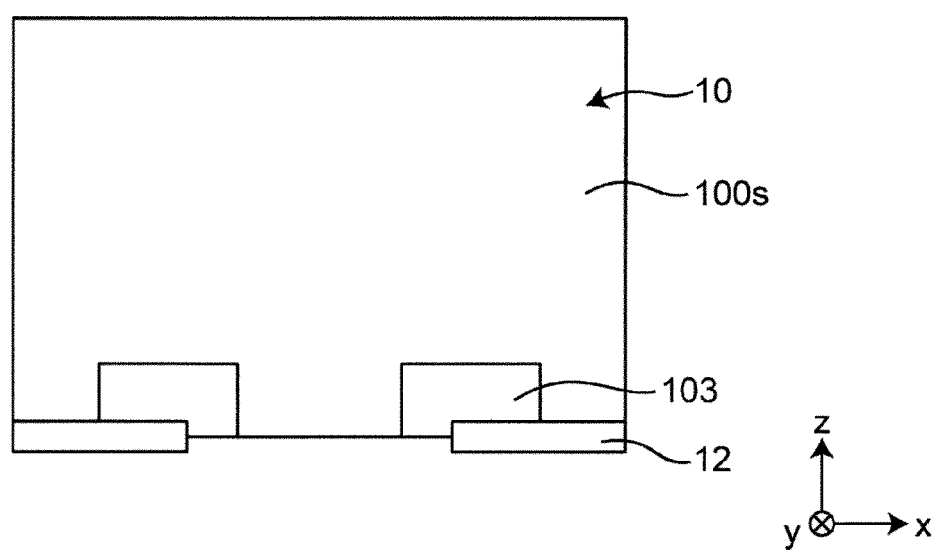
FIG. 12 is a schematic side view of the inductor component.

FIG. 12 is a schematic side view of the inductor component 1. FIG. 12 is a figure showing the inductor component 1 as viewed from a side surface 100s parallel to the L direction and the T direction in a plane in which the bottom surface 100b and the top surface 100t are connected. FIG. 12 does not show the circularly extending wiring 110.

As shown in FIG. 12, in the inductor component 1, the single-layer glass plate 10 includes a reinforcing portion 103 that is harder than the vicinity thereof. An electronic component, such as the inductor component 1, tends to be damaged due to an external force or a thermal shock applied to the inductor component 1 during a manufacturing process or after mounting. In particular, at interfaces between elements having different physical properties, that is, between the single-layer glass plate 10, the outer-surface conductors 11, the terminal electrodes 12, and the through wirings 13, stress tends to concentrate and cracks tend to be produced in the single-layer glass plate 10 with the interfaces as starting points. In the structure above, since the strength can be properly reinforced by the reinforcing portion 103 against local damage and cracks, the strength of the inductor component 1 is increased.

The reinforcing portion 103 can be formed, for example, by using a photosensitive glass for the single-layer glass plate 10 and, similarly to the crystallization portion 101 above, by partly crystalizing the single-layer glass plate 10. The transmittance of the reinforcing portion 103 can be controlled as appropriate on the basis of, for example, the irradiation amount/irradiation time of ultraviolet light or heating.

In particular, it is desirable that the reinforcing portion 103 be positioned below the outer-surface conductors 11 or below the terminal electrodes 12. This makes it possible to effectively reduce the local damage and cracks above. Further, it is desirable that the reinforcing portion 103 be positioned below an outer peripheral edge of each outer-surface conductor 11 or an outer peripheral edge of each terminal electrode 12.

The manufacturing method of the inductor component 1 can also be changed as appropriate. For example, in the manufacturing method described above, individual pieces of single-layer glass plates may be formed by cutting the photosensitive glass board by a photolithography method, the photosensitive glass board having the outer-surface conductors formed thereon.

According to the manufacturing method above, it is possible to cut the photosensitive glass board with high precision while reducing chipping when dividing the photosensitive glass board into pieces. Since this method does not cause a physical shock to be applied to the photosensitive glass board when cutting with a dicing machine as when a dicing blade is used, it is possible to suppress micro-cracks from being produced in the single-layer glass plates. Further, compared to when a dicing blade is used, it is possible to reduce a cutting margin when dividing the photosensitive glass board into pieces, and to increase the number of single-layer glass plates that can be obtained from a photosensitive glass board of the same size.

Second Embodiment

Figure 13:
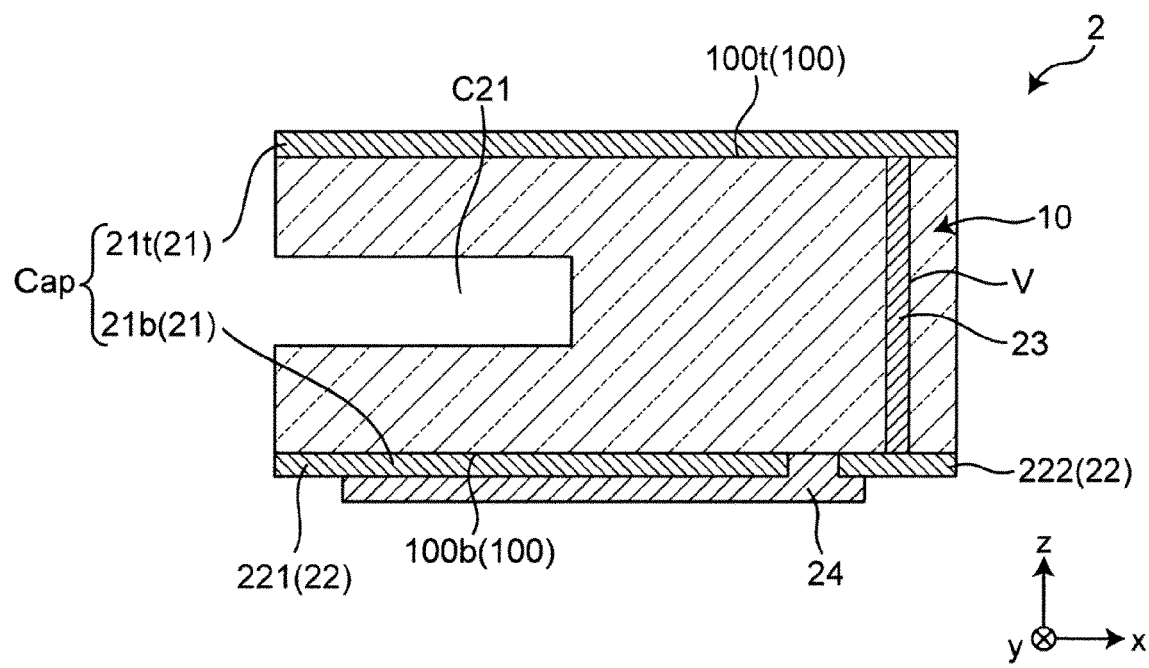
FIG. 13 is a schematic sectional view of a capacitor component.

Although, in the first embodiment, the outer-surface conductors are part of the inductor element, the outer-surface conductors are not limited thereto and thus may be part of an electrical element other than the inductor element L. FIG. 13 is a schematic sectional view of a capacitor component 2 according to a second embodiment. As shown in FIG. 13, the capacitor component 2 is a surface-mount-type electronic component that includes, as an electrical element, a capacitor element Cap widely used in an electronic circuit.

The capacitor component 2 includes the single-layer glass plate 10 above, outer-surface conductors 21 that are part of the capacitor element Cap serving as an electrical element, and terminal electrodes 22 that are terminals of the capacitor element Cap. The outer-surface conductors 21 are disposed above outer surfaces 100 of the single-layer glass plate 10. The terminal electrodes 22 are disposed above an outer surface 100 and are electrically connected to the outer-surface conductors 21.

Due to the structure above, in the capacitor component 2, since the outer-surface conductors 21 and the terminal electrodes 22 are disposed above the corresponding outer surfaces 100 of the single-layer glass plate 10, the outer-surface conductors 21 and the terminal electrodes 22 are not placed in the single-layer glass plate 10. Therefore, the capacitor component 2 makes it possible to reduce the influence of firing.

In the capacitor component 2, the outer surfaces 100 of the single-layer glass 10 include a bottom surface 100b that is one principal surface of the single-layer glass plate 10 and a top surface 100t that is positioned on the back side of the bottom surface 100b, and the outer-surface conductors 21 include a substantially planar bottom-surface flat-plate electrode 21b, where the outer-surface conductor 21 is disposed above the bottom surface 100b (in an opposite z direction in FIG. 13) and a substantially planar top-surface flat-plate electrode 21t that is disposed above the top surface 100t (in the z direction in FIG. 13).

Due to the structure above, in the capacitor component 2, the capacitor element Cap is formed by causing the bottom-surface flat-plate electrode 21b and the top-surface flat-plate electrode 21*t* to be opposite to each other with the single-layer glass plate 10, which is a dielectric layer, interposed therebetween.

In the capacitor component 2, the single-layer glass plate 10 has a cavity C21 at a location interposed between the bottom-surface flat-plate electrode 21*b* and the top-surface flat-plate electrode 21*t*. The cavity C21 may be the crystallization portion 101 shown in FIG. 2. The capacitor component 2 may include a highly dielectric portion that has a dielectric constant higher than that of the single-layer glass plate 10 and that is disposed in the cavity C21.

Due to the structure above, in the capacitor component 2, it is possible to adjust the capacitance value of the capacitor element Cap by using the cavity C21, the crystallization portion 101, or the highly dielectric portion. Specifically, the dielectric constant of the cavity C21 and the dielectric constant of the crystallization portion 101 are lower than the dielectric constant of the single-layer glass plate 10, so that it is possible to reduce the overall dielectric constant of the dielectric layer on whose respective sides the bottom-surface flat-plate electrode 21*b* and the top-surface flat-plate electrode 21*t* are disposed. The highly dielectric portion has a dielectric constant that is higher than that of the single-layer glass plate 10, so that it is possible to increase the overall dielectric constant of the dielectric layer above.

In particular, according to a method of forming the cavity C21 and the crystallization portion 101 by using the photosensitive glass board above, it is possible to form the cavity C21 and the crystallization portion 101 after forming the capacitor element Cap including the bottom-surface flat-plate electrode 21*b* and the top-surface flat-plate electrode 21*t* and to adjust the electrical characteristics of the capacitor element Cap after measuring the electrical characteristics of the capacitor element Cap, so that it is possible to adjust the capacitance of the capacitor component 2 and to increase yield. The capacitor component 2 may include only one of the cavity C21, the crystallization portion 101, and the highly dielectric portion, or may include a combination of these.

The capacitor component 2 further includes through wirings 23 that are at least part of the capacitor element Cap, the through wirings 23 extending through through holes V formed in the single-layer glass plate 10 and being electrically connected to the outer-surface conductors 21.

Due to the structure above, in the capacitor component 2, it is possible to form a wiring in a vertical direction with respect to the outer-surface conductors 21 and the terminal electrodes 22, which are disposed above the corresponding outer surfaces 100, and the conductor element Cap is formed with greater freedom. In the capacitor component 2, the through wirings 23 are wirings that connect the top-surface flat-plate electrode 21*t* and the terminal electrodes 22.

In the capacitor component 2, the terminal electrodes 22 include a first terminal electrode 221 and a second terminal electrode 222, which are input/output terminals of the capacitor element Cap, and the first terminal electrode 221 and the second terminal electrode 222 each have a shape including a principal surface that is parallel to the bottom surface 100*b* at a location above the bottom surface 100*b* (opposite z direction).

Due to the structure above, since the capacitor component 2 includes the input/output terminals of the capacitor element Cap, each having a surface that allows solder to adhere thereto in a direction parallel to the bottom surface 100*b*, on a side of the bottom surface 100*b*, the capacitor component 2 is a surface-mount-type electronic component that allows surface mounting with the bottom surface 100*b* being a mount surface, and that can reduce a mounting area.

The capacitor component 2 further includes a protective film 24 that covers a part of the bottom-surface flat-plate electrode 21*b*. This makes it possible to prevent damage to the bottom-surface flat-plate electrode 21*b* from occurring and to increase insulation property. In particular, by causing a part of the bottom-surface flat-plate electrode 21*b* to be exposed from the protective film 24, it is possible to define this part as the terminal electrode 22 (the first terminal electrode 221).

Third Embodiment

Figure 14:
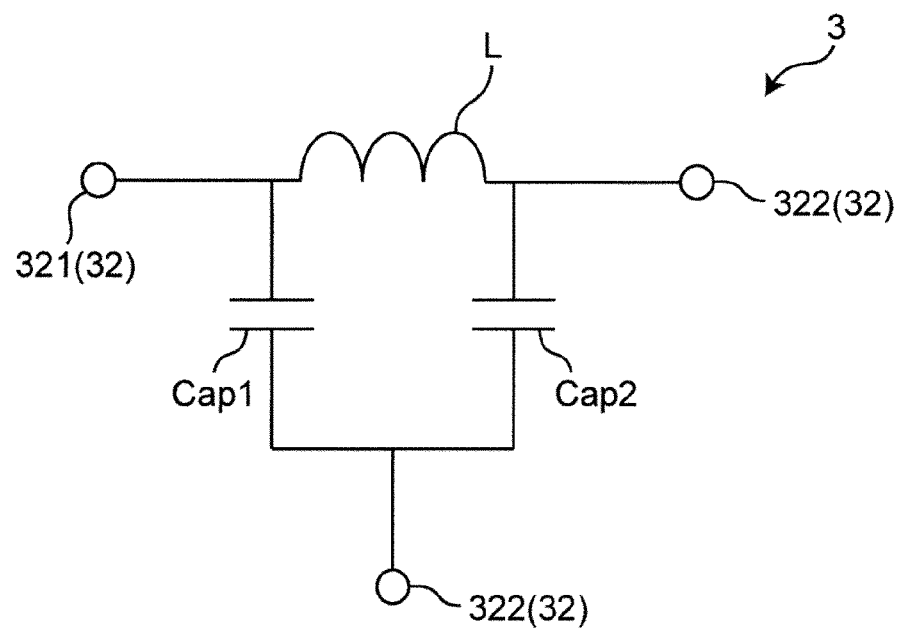
FIG. 14 is an electrical circuit diagram of an electronic component.

Although, in the first embodiment and the second embodiment, the electronic component is an electronic component including one electrical element, the electronic component is not limited thereto, so that the electronic component may include a plurality of electrical elements therein. FIG. 14 is an electrical circuit diagram of an electronic component 3 according to a third embodiment. The electronic component 3 is a surface-mount-type electronic component that includes, as electrical elements, an inductor element L and capacitor elements Cap1 and Cap2.

As shown in FIG. 14, in the electronic component 3, a first terminal electrode 321 is a common terminal of the inductor element L and the capacitor element Cap1, a second terminal electrode 322 is a common terminal of the inductor element L and the capacitor element Cap2, and a third terminal electrode 323 is a common terminal of the capacitor elements Cap1 and Cap2. Therefore, in the electronic component 3, the inductor element L and the capacitor elements Cap1 and Cap2 constitute a π-type LC filter.

Figure 15:
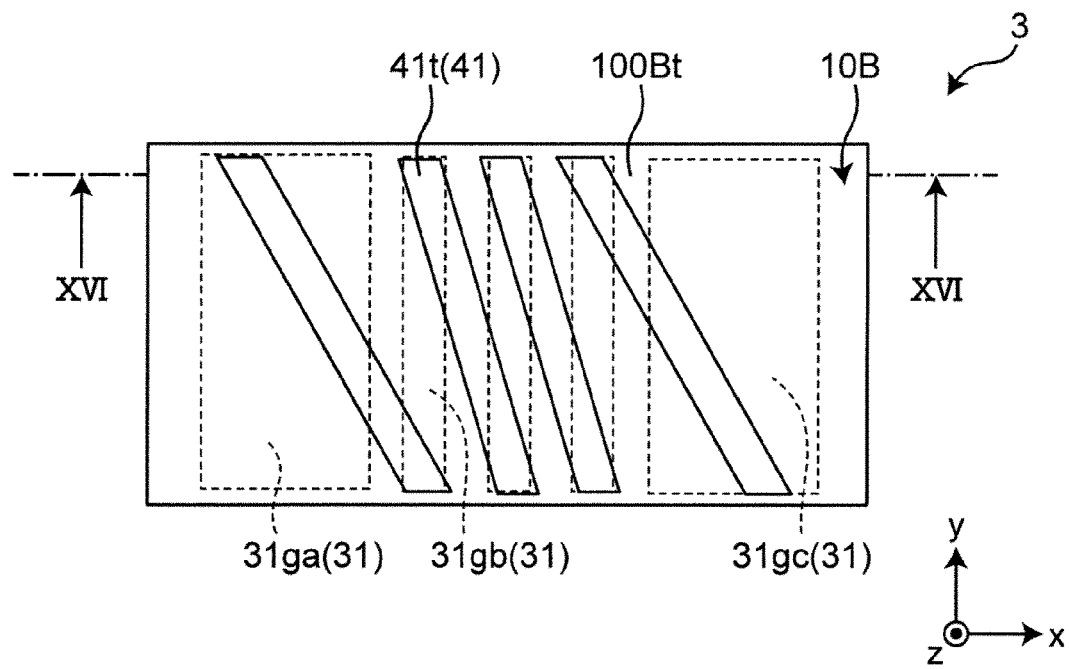
FIG. 15 is a schematic top view of the electronic component.
Figure 16:
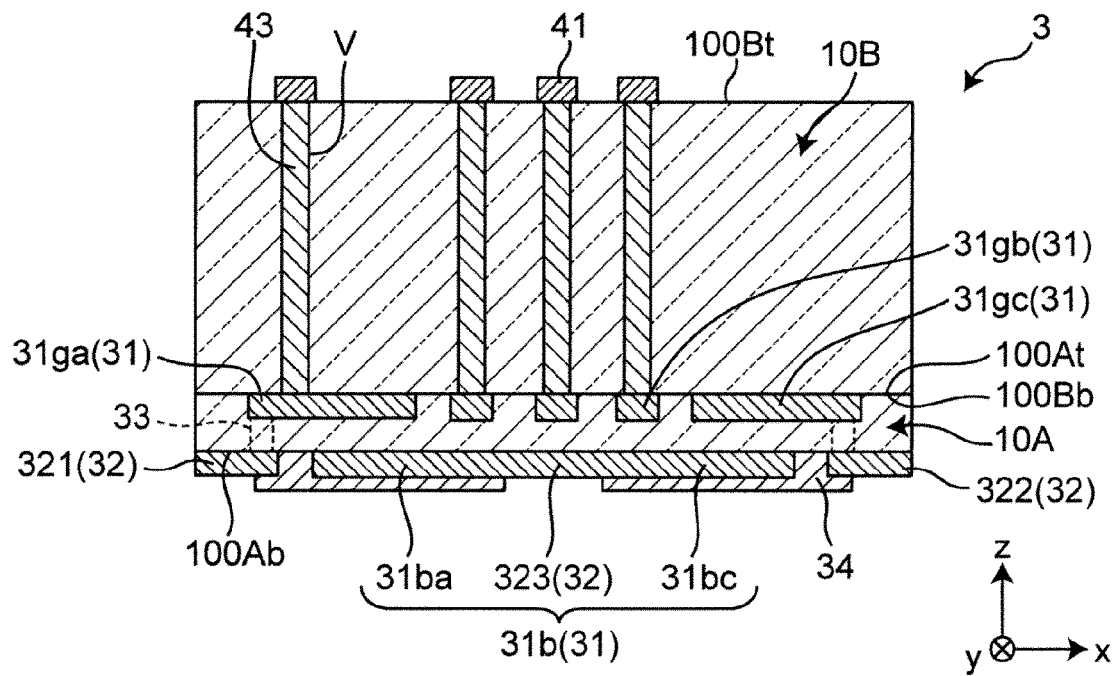
FIG. 16 is a schematic sectional view of the electronic component.
Figure 17:
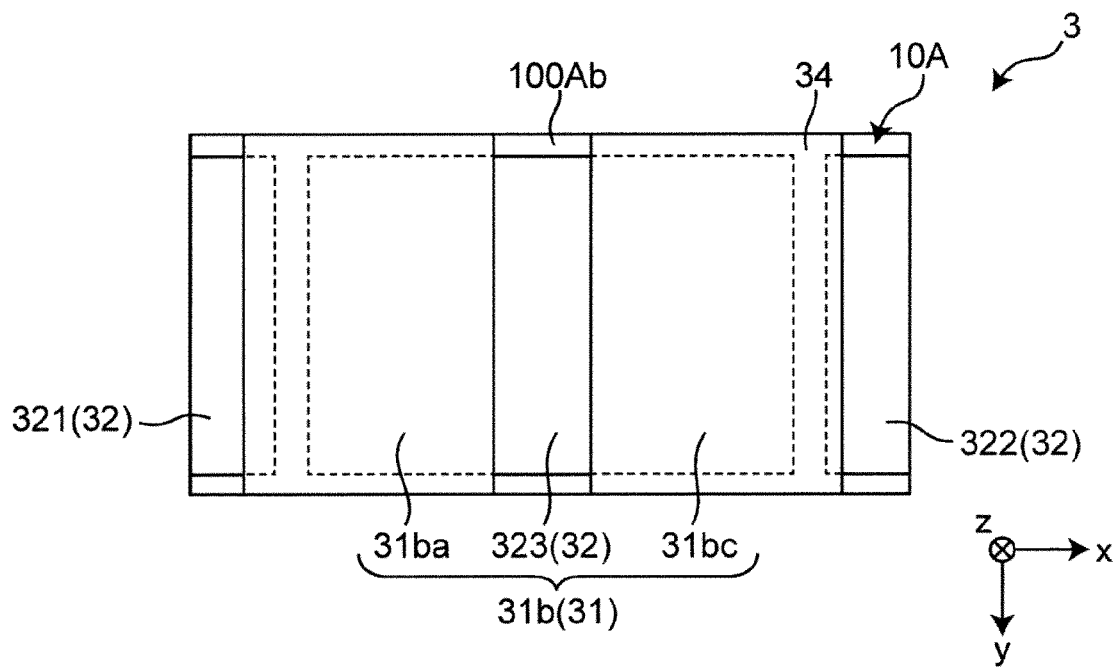
FIG. 17 is a schematic bottom view of the electronic component.

Next, a specific structure of the electronic component 3 is described. FIG. 15 is a schematic top view of the electronic component 3. FIG. 16 is a schematic sectional view of the electronic component 3. FIG. 17 is a schematic bottom view of the electronic component 3. FIG. 16 is a sectional view along an alternate long and short dashed line, that is, along XVI-XVI shown in FIG. 15.

The electronic component 3 includes a single-layer glass plate 10A, outer-surface conductors 31, and terminal electrodes 32 that are terminals of the inductor element L, the capacitor element Cap1, or the capacitor element Cap2. The outer-surface conductors 31 are each disposed above (opposite z direction) a bottom surface 100Ab or above (z direction) a top surface 100At, the bottom surface 100Ab and the top surface 100At being outer surfaces of the single-layer glass plate 10A, and are part of the inductor element L, the capacitor element Cap1, or the capacitor element Cap2. The terminal electrodes 32 are disposed above (opposite z direction) the bottom surface 100Ab and are electrically connected to the outer-surface conductors 31.

The outer-surface conductors 31 disposed above the top surface 100At are grooved-portion conductors 31*ga*, 31*gb*, and 31*gc* similarly to the grooved-portion conductors 11*g* shown in FIG. 3.

Due to the structure above, in the electronic component 3, since the outer-surface conductors 31 are each disposed on a corresponding one of the outer surfaces 100Ab and 100At of the single-layer glass plate 10A, the outer-surface conductors 31 are not placed in the single-layer glass plate 10A. Therefore, the electronic component 3 makes it possible to reduce the influence of firing.

The electronic component 3 further includes a second single-layer glass plate 10B that differs from the single-layer glass plate 10A. The second single-layer glass plate 10B is disposed above (z direction) the grooved-portion conductors 31ga, 31gb, and 31gc. Conversely, this means that the grooved-portion conductors 31ga, 31gb, and 31gc are disposed above (opposite z direction) the bottom surface 100Bb, which is an outer surface, with respect to the second single-layer glass plate 10B.

Due to the structure above, in the electronic component 3, the grooved-portion conductors 31ga, 31gb, and 31gc can be internal conductors, and three-dimensional wiring is possible by providing multi-layers, so that the electronic component 3 is designed with greater freedom. As described above, since the grooved-portion conductors 31ga, 31gb, and 31gc are disposed above the top surface 100At and the bottom surface 100Bb, which are outer surfaces, with respect to the single-layer glass plate 10A and the second single-layer glass plate 10B, the grooved-portion conductors 31ga, 31gb, and 31gc are not placed in the single-layer glass plate 10A and the second single-layer glass plate. Therefore, even in the structure above, the electronic component 3 makes it possible to reduce the influence of firing.

In the electronic component 3, the top surface 100At of the single-layer glass plate 10A and the bottom surface 100Bb of the second single-layer glass plate 10B are joined to each other. Therefore, the electronic component 3 can have a multi-layer structure. A method of joining the single-layer glass plate 10A and the second single-layer glass plate 10B when the grooved-portion conductors 31ga, 31gb, and 31gc have been formed after sintering the single-layer glass plate 10A and the second single-layer glass plate 10B is described below.

The electronic component 3 further includes outer-surface conductors 41 that are disposed above (z direction) a top surface 100Bt, which is an outer surface of the second single-layer glass plate 10B, and are part of the inductor element L. Due to the structure above, in the electronic component 3, since the outer-surface conductors 41 are disposed above an outer surface of the second single-layer glass plate 10B, the outer-surface conductors 41 are not placed in the second single-layer glass plate 10B. Therefore, the electronic component 3 makes it possible to reduce the influence of firing.

In the electronic component 3, the grooved-portion conductors 31ga, 31gb, and 31gc include substantially planar grooved-portion flat-plate electrodes 31ga and 31gc, and the outer-surface conductors 31 include substantially planar facing flat-plate electrodes 31b facing the grooved-portion flat-plate electrodes 31ga and 31gc with the single-layer glass plate 10A interposed therebetween.

Due to the structure above, in the electronic component 3, the grooved-portion flat-plate electrodes 31ga and 31gc and the corresponding facing flat-plate electrodes 31b constitute the corresponding capacitors Cap1 and Cap2. Specifically, the facing flat-plate electrodes 31b include facing flat-plate electrodes 31ba and 31bc facing the corresponding grooved-portion flat-plate electrodes 31ga and 31gc; the grooved-portion flat-plate electrode 31ga and the facing flat-plate electrode 31ba constitute the capacitor element Cap1; and the grooved-portion flat-plate electrode 31gc and the facing flat-plate electrode 31bc constitute the capacitor element Cap2. In this way, the electronic component 3 has the capacitor elements Cap1 and Cap2 built therein.

Further, in the electronic component 3, as shown in FIGS. 16 and 17, by the facing flat-plate electrodes 31b including a third terminal electrode 323 that is a portion exposed from the protective film 34, the terminal electrodes 32 are provided.

Due to the structure above, in the electronic component 3, it is possible to reduce the size and height of the electronic component 3 as an electronic component including an LC filter. In ordinary multi-layer-type electronic components, from the viewpoint of ensuring strength, an outer-layer portion between internal electrodes and the outer surfaces of such electronic components is made thicker than interlayer insulation layers disposed in the interior. Therefore, when the facing flat-plate electrodes are disposed on an outer surface of such electronic components, the electrode interval between the facing flat-plate electrodes and flat-plate electrodes inside a multi-layer body is increased, as a result of which the required electrical characteristics may not be obtained. Therefore, ordinarily, the facing flat-plate electrodes facing the flat-plate electrodes inside the multi-layer body are also disposed inside the multi-layer body. Therefore, in addition to the structure being a three-layer structure including the flat-plate electrodes, the facing flat-plate electrodes, and the terminal electrodes, the outer layer between the facing flat-plate electrodes and the terminal electrodes becomes thicker than the interlayer insulation layers between the flat-plate electrodes and the facing flat-plate electrodes, and the overall thickness is increased.

On the other hand, in the electronic component 3, since a sufficient strength of the single-layer glass plate 10A can be ensured, it is possible to thinly process the glass plate than before and to dispose the facing flat-plate electrodes 31b on the outer surface 100Ab. As a result, the electronic component 3 is a two-layer structure including the grooved-portion flat-plate electrodes 31ga and 31gc and the facing flat-plate electrodes 31b, and the single-layer glass plate 10A can be made sufficiently thin and compared to existing structures, the size and height of the electronic component 3 can be reduced. In particular, in the electronic component 3, since a side of the top surface 100At of the single-layer glass plate 10A is a side of the grooved-portion flat-plate electrodes 31ga and 31gc, it is possible to reduce the distance between the electrodes of each of the capacitor elements Cap1 and Cap2 while reducing the influence on the strength (the thickness) of the single-layer glass plate 10A.

In the electronic component 3, as described above, since the facing flat-plate electrodes 31b are used as the terminal electrodes 32, it is possible to reduce the number of electrodes for forming the capacitor elements Cap1 and Cap2, so that it is possible to reduce the stray capacitance, improve the electrical characteristics, and reduce variations in the characteristics.

The electronic component 3 further includes through wirings 33 and 43 that are at least part of the inductor element L, the capacitor element Cap1, or the capacitor element Cap2, the through wirings 33 and 43 extending through through holes V formed in a corresponding one of the single-layer glass plates 10A and 10B and being electrically connected to a corresponding one of the outer-surface conductors 31 and 41.

Due to the structure above, in the electronic component 3, it is possible to form a wiring in a vertical direction with respect to the outer-surface conductors 31 and 41 and the terminal electrodes 32, which are disposed above the corresponding outer surfaces 100, and the inductor element L, the capacitor element Cap1, or the capacitor element Cap2 is formed with greater freedom.

In the electronic component 3, the through wirings 33 are wirings that connect the corresponding grooved-portion flat-plate electrodes 31ga and 31gc to the corresponding first and second terminal electrodes 321 and 322. In the electronic component 3, the through wirings 43 connect the grooved-portion conductors 31gb and the corresponding outer-surface conductors 41 to each other, and a circularly extending wiring constituted by the grooved-portion conductors 31gb, the outer-surface conductors 41, and the through wirings 43 circularly extends around a winding axis (not shown) that is parallel to the bottom surface 100Ab. Due to the structure above, the circularly extending wiring constitutes a main portion of the inductor element L, and becomes the electronic component 3 including the inductor element L.

In the electronic component 3, the terminal electrodes 32 include the first terminal electrode 321, the second terminal electrode 322, and the third terminal electrode 323, which are each an input/output terminal of any of the inductor element L, the capacitor element Cap1, and the capacitor element Cap2; and, at locations above (opposite z direction) the bottom surface 100Ab, the first terminal electrode 321, the second terminal electrode 322, and the third terminal electrode 323 each have a shape including a principal surface that is parallel to the bottom surface 100Ab.

Due to the structure above, since the electronic component 3 includes the input/output terminals of the inductor element L, the capacitor elements Cap1, or the capacitor element Cap2, each having a surface that allows solder to adhere thereto in a direction parallel to the bottom surface 100Ab, on a side of the bottom surface 100Ab, the electronic component 3 is a surface-mount-type electronic component that allows surface-mounting with the bottom surface 100Ab being a mount surface and that can reduce a mounting area.

The electronic component 3 further includes the protective film 34 that covers part of the facing flat-plate electrodes 31b, specifically, the facing flat-plate electrodes 31ba and 31bc. Therefore, it is possible to prevent damage to the facing flat-plate electrodes 31ba and 31bc from occurring and to increase insulation property. In particular, by causing a part of the facing flat-plate electrodes 31b to be exposed from the protective film 34, it is possible to define this part as the terminal electrode 32 (the third terminal electrode 323).

Method of Joining Single-Layer Glass Plate 10A and Second Single-Layer Glass Plate 10B In the electronic component 3, the top surface 100At of the single-layer glass plate 10A and the bottom surface 100Bb of the second single-layer glass plate 10B are joined to each other. The glass plates may be directly joined to each other by, for example, using a photosensitive glass for the single-layer glass plate 10A or the second single-layer glass plate 10B and activating the surface of the photosensitive glass by wet etching or dry etching. The top surface 100At of the single-layer glass plate 10A and the bottom surface 100Bb of the second single-layer glass plate 10B may be joined to each other by interposing an adhesive layer, such as a thermosetting resin layer or a thermoplastic resin layer, between them.

At this time, for example, the grooved-portion conductors 31ga, 31gb, and 31gc may be formed on the single-layer glass plate 10A before the joining or may be formed after the single-layer glass plate 10A and the second single-layer glass plate 10B have been joined to each other. Specifically, for example, it is possible to, after forming grooved portions in the top surface 100At of the single-layer glass plate 10A and disposing the grooved-portion conductors 31ga, 31gb, and 31gc in the grooved portions, join the top surface 100At of the single-layer glass plate 10A and the bottom surface 100Bb of the second single-layer glass plate 10B to each other.

The method is not limited thereto. For example, it is possible to form grooved portions in the top surface 100At of the single-layer glass plate 10A after joining the top surface 100At to the second single-layer glass plate 10B or join the single-layer glass plate 10A and the second single-layer glass plate 10B to each other after forming grooved portions in the top surface 100At, and then form the grooved-portion conductors 31ga, 31gb, and 31gc in the grooved portions. When the grooved-portion conductors 31ga, 31gb, and 31gc are formed in the grooved portions after the joining of the plates, the grooved-portion conductors 31ga, 31gb, and 31gc can be brought into close contact with the top surface 100At of the single-layer glass plate 10A and the bottom surface 100Bb of the second single-layer glass plate 10B, which is desirable. Even if an adhesive layer is used, spaces between the grooved-portion conductors 31ga, 31gb, and 31gc and each of the top surface 100At of the single-layer glass plate 10A and the bottom surface 100Bb of the second single-layer glass plate 10B can be filled due to plastic deformation of the adhesive layer, which is desirable.

In the electronic component 3, although the grooved-portion flat-plate electrodes 31ga and 31gc and the facing flat-plate electrodes 31ba and 31bc face each other with the single-layer glass plate 10A interposed therebetween, the outer-surface conductors 41 may include the substantially planar facing flat-plate electrodes or the terminal electrodes that face with the second single-layer glass plate 10B interposed therebetween.

In the electronic component 3, the facing flat-plate electrodes 31b may be grooved-portion flat-plate electrodes. At this time, the grooved-portion flat-plate electrodes are the terminal electrodes 32.

In the electronic component 3, although the circularly extending wiring, which is a main portion of the inductor element L, circularly extends on a side of the second single-layer glass plate 10B, the circularly extending wiring may circularly extend on a side of the single-layer glass plate 10A.

Fourth Embodiment

Figure 18:
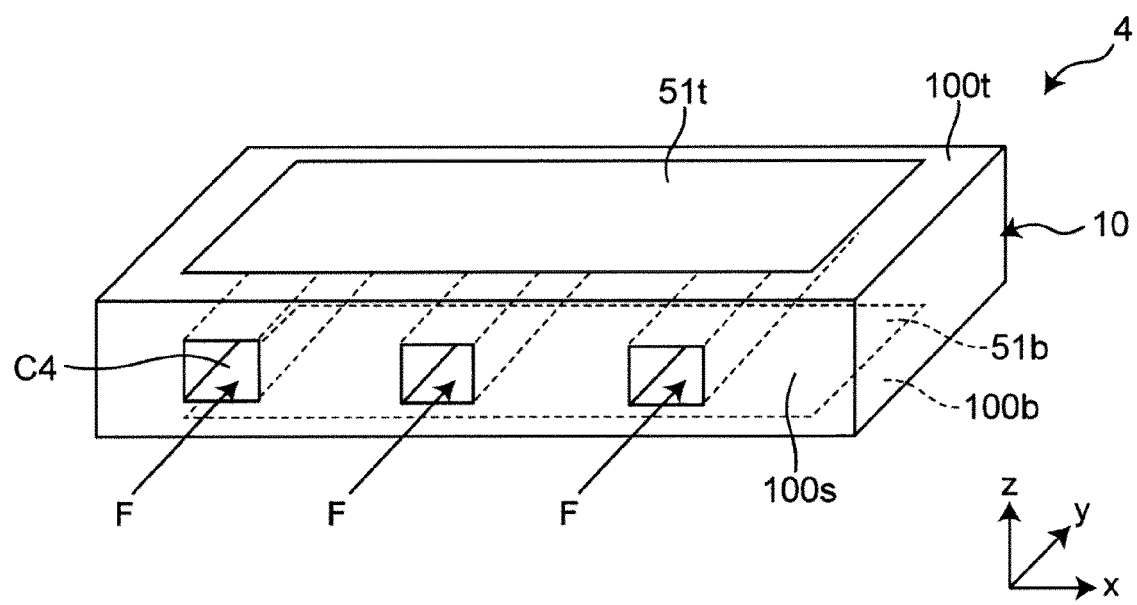
FIG. 18 is a schematic perspective view of an electronic component.

Although, in the first embodiment to the third embodiment, the electronic components are surface-mount-type electronic components, they are not limited thereto. For example, a three-dimensional mounting electronic component may be used. FIG. 18 is a schematic perspective view of an electronic component 4 according to a fourth embodiment. The electronic component 4 is a three-dimensional mounting sensor including a sensor element that detects whether or not there is a fluid F and a flow rate.

In the electronic component 4, a top-surface flat-plate electrode 51t and a bottom-surface flat-plate electrode 51b that are disposed above a top surface 100t and a bottom surface 100b, respectively, of a single-layer glass plate 10 are outer-surface conductors, which are part of the sensor element, and are terminal electrodes, which are terminals of the sensor element. That is, even the electronic component 4 includes the single-layer glass plate 10, and the top-surface flat-plate electrode 51t and the bottom-surface flat-plate electrode 51b, which are disposed above the outer surface 100t and the outer surface 100b of the single-layer glass plate 10, respectively, and which are part of the sensor element and which are terminals. Therefore, the electronic component 4 makes it possible to reduce the influence of firing.

Since the electronic component 4 includes the terminal electrodes 51*t* and 51*b* at the respective top and bottom surfaces 100*t* and 100*b*, for example, if one of the terminal electrodes 51*t* and 51*b* is mounted on a land of a board, such as a substrate or an interposer, and the other of the terminal electrodes 51*t* and 51*b* is connected to a terminal of a semiconductor chip by using solder, a bonding wire, or the like, three-dimensional mounting becomes possible.

In the electronic component 4, the single-layer glass plate 10 includes principal surfaces, that is, the top surface 100*t* and the bottom surface 100*b*, and a side surface 100*s* that is orthogonal to the top surface 100*t* and the bottom surface 100*b*. The top-surface flat-plate electrode 51*t* and the bottom-surface flat-plate electrode 51*b*, which are outer-surface conductors, are disposed at the respective principal surfaces that are outer surfaces. The single-layer glass plate 10 includes a cavity C4 that opens in the side surface 100*s*.

Due to the structure above, an electronic element using the cavity C4 can be designed. Specifically, with the cavity C4 being defined as a flow path, the electronic component 4 is capable of detecting whether or not a fluid that flows in the cavity C4 exists or the flow rate of the fluid as changes in electrostatic capacity at the top-surface flat-plate electrode 51*t* and the bottom-surface flat-plate electrode 51*b*, and can be used as a fluid sensor. However, the method of use of the cavity C4 is not limited thereto. For example, it is possible to, by using the cavity C4 as a through hole in which a through wiring is disposed, design a more sophisticated electrical element. For example, if the through wiring is connected to a ground electrode of a mounting board via the side surface 100*s*, it is possible to, when a surge voltage caused by static electricity or a lightning strike occurs, form a path into which a surge current is caused to flow to a side of the ground electrode and provide the electronic component 4 with the function of dealing with static electricity.

Other Embodiments

The various features that have been described in the first embodiment, the second embodiment, the third embodiment, and the fourth embodiment above can be individually added, deleted, and changed in relation to each of the embodiments or in relation to other embodiments. Further, publicly known structures can be added to, deleted from, and changed in relation to these embodiments.

Figure 19:
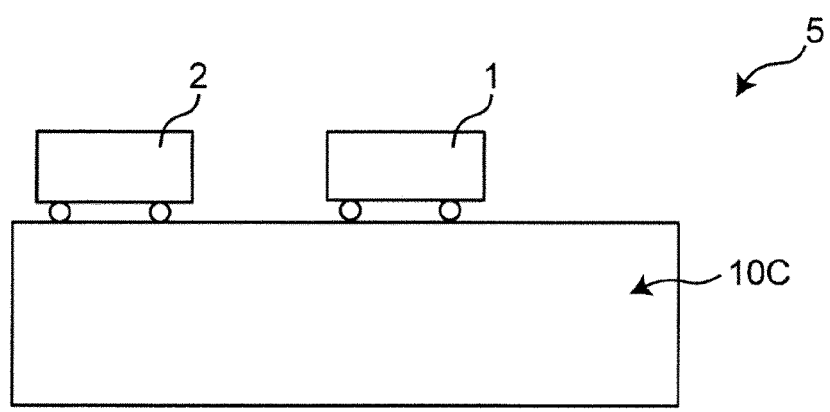
FIG. 19 is a schematic sectional view of an electronic-component mounting board.

The electronic components according to the first to fourth embodiments above or according to embodiments in which any of the first to fourth embodiments has been modified as appropriate are desirably mounted on a particular mounting board. FIG. 19 is a schematic sectional view of an electronic-component mounting board 5.

The electronic-component mounting board 5 includes the inductor component 1 of the first embodiment, the capacitor component 2 of the second embodiment, and a glass board 10C on which the inductor component 1 and the capacitor component 2 of the second embodiment are mounted.

According to the structure above, since the single-layer glass plate 10, which is a structural body of the inductor component 1 and the capacitor component 2, and the glass board 10C are made of the same material and their coefficients of linear expansion are close to each other, the inductor component 1 and the capacitor component 2 can be made more reliable with respect to thermal expansion and thermal shrinkage occurring in the glass board 10C in, for example, a thermal shock test.

As described above, what is mounted on the glass board 10C is an electronic component using a single-layer glass plate as a structural body, and may be, for example, the electronic component 3 or the electronic component 4. Electronic components other than these electronic components may also be mounted. Even in this case, at least electronic components using a single-layer glass plate as a structural body can be made more reliable.

The glass board 10C may be one corresponding to a printed wiring board used in an electronic device, an auxiliary board that is mounted on the printed wiring board, such as a mother board, or a built-in board, such as an interposer or a substrate, used in a semiconductor or an electronic module.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An electronic component comprising:
    a single-layer glass plate;
    at least one outer-surface conductor that is disposed above an outer surface of the single-layer glass plate and that is at least a part of an electrical element;
    at least one terminal electrode that is a terminal of the electrical element, the terminal electrode being disposed above the outer surface of the single-layer glass plate and being electrically connected to the outer-surface conductor; and
    an underlying insulation layer that is disposed on the outer surface of the single-layer glass plate, wherein
    the terminal electrode is disposed on the underlying insulation layer.

2. The electronic component according to claim 1, wherein
    the outer surface includes a bottom surface that is one principal surface of the single-layer glass plate,
    the at least one terminal electrode includes a first terminal electrode and a second terminal electrode, which are input/output terminals of the electrical element, and
    the first terminal electrode and the second terminal electrode each have a shape including a principal surface above the bottom surface, the principal surface being parallel to the bottom surface.

3. The electronic component according to claim 1, further comprising:
    a through wiring that is at least a part of the electrical element, the through wiring extending through a through hole formed in the single-layer glass plate and being electrically connected to the outer-surface conductor.

4. The electronic component according to claim 3, wherein
    the outer surface includes a bottom surface that is one principal surface of the single-layer glass plate and a top surface that is positioned on a back side of the bottom surface,
    the at least one terminal electrode includes a first terminal electrode and a second terminal electrode, which are input/output terminals of the electrical element,
    the first terminal electrode and the second terminal electrode each have a shape including a principal surface above the bottom surface, the principal surface being parallel to the bottom surface,
    the at least one outer-surface conductor includes a bottom-surface conductor and a top-surface conductor that are disposed above the bottom surface and above the top surface, respectively, and that are electrically connected to each other by the through wiring, and a circularly extending wiring that is formed from the bottom-surface conductor, the top-surface conductor, and the through wiring circularly extends around a winding axis that is parallel to the bottom surface.

5. The electronic component according to claim 4, wherein
the single-layer glass plate includes a cavity or a crystallization portion at a location including the winding axis.

6. The electronic component according to claim 4, wherein
the circularly extending wiring circularly extends at least two times around the wiring axis, and
the single-layer glass plate includes a cavity or a crystallization portion between adjacent portions of the circularly extending wiring.

7. The electronic component according to claim 1, wherein
the single-layer glass plate includes a cavity or a crystallization portion in a vicinity of the terminal electrode.

8. The electronic component according to claim 1, wherein
the outer surface includes a bottom surface that is one principal surface of the single-layer glass plate and a top surface that is positioned on a back side of the bottom surface,
the outer-surface conductor includes a substantially planar bottom-surface flat-plate electrode that is disposed above the bottom surface and a substantially planar top-surface flat-plate electrode that is disposed above the top surface, and
the single-layer glass plate includes a cavity or a crystallization portion at a location interposed between the bottom-surface flat-plate electrode and the top-surface flat-plate electrode.

9. The electronic component according to claim 8, wherein
the single-layer glass plate includes the cavity at the location interposed between the bottom-surface flat-plate electrode and the top-surface flat-plate electrode, and
the electronic component further includes a highly dielectric portion that has a dielectric constant higher than a dielectric constant of the single-layer glass plate and that is disposed in the cavity.

10. An electronic-component manufacturing method that is a method of manufacturing the electronic component according to claim 1, the method comprising:
forming the outer-surface conductor on an outer surface of a mother single-layer glass plate; and
cutting the mother single-layer glass plate, on which the outer-surface conductor has been formed, by a photolithography method to form the single-layer glass plate.

11. An electronic-component mounting board comprising:
the electronic component of claim 1; and
a glass board at which the electronic component is mounted.

12. The electronic component according to claim 1, further comprising
an anchor section that protrudes into the single-layer glass plate from the terminal electrode.

13. The electronic component according to claim 1, wherein
the underlying insulation layer is disposed on the outer-surface conductor.

14. The electronic component according to claim 1, wherein
the single-layer glass plate includes a principal surface that is the outer surface where the outer-surface conductor is disposed, a side surface that is orthogonal to the principal surface, and a cavity that opens in the side surface.

15. An electronic component comprising:
a single-layer glass plate;
at least one outer-surface conductor that is disposed above an outer surface of the single-layer glass plate and that is at least a part of an electrical element; and
at least one terminal electrode that is a terminal of the electrical element, the terminal electrode being disposed above the outer surface of the single-layer glass plate and being electrically connected to the outer-surface conductor,
wherein
the single-layer glass plate includes a low transmittance portion that has a light transmittance lower than a light transmittance of a vicinity thereof.

16. The electronic component according to claim 15, wherein
the low transmittance portion is positioned on an outer peripheral edge of a principal surface of the single-layer glass plate.

17. The electronic component according to claim 15, wherein
the low transmittance portion has a cross-shape at a principal surface of the single-layer glass plate.

18. An electronic component comprising:
a single-layer glass plate;
at least one outer-surface conductor that is disposed above an outer surface of the single-layer glass plate and that is at least a part of an electrical element;
at least one terminal electrode that is a terminal of the electrical element, the terminal electrode being disposed above the outer surface of the single-layer glass plate and being electrically connected to the outer-surface conductor; and
a second single-layer glass plate that differs from the single-layer glass plate, wherein
the outer surface of the single-layer glass plate includes a grooved portion that is recessed with respect to a vicinity thereof,
the outer-surface conductor includes a grooved-portion conductor that is disposed in the grooved portion, and
the second single-layer glass plate is disposed above the grooved-portion conductor.

19. The electronic component according to claim 13, wherein
a thickness of the grooved-portion conductor is less than a depth of the grooved portion.

20. The electronic component according to claim 13, wherein
a thickness of the grooved-portion conductor is greater than a depth of the grooved portion.

21. The electronic component according to claim 18, wherein
the grooved-portion conductor includes a substantially planar grooved-portion flat-plate electrode,
the outer-surface conductor includes a substantially planar facing flat-plate electrode facing the grooved-portion flat-plate electrode with the single-layer glass plate or the second single-layer glass plate interposed therebetween, and the grooved-portion flat-plate electrode or the facing flat-plate electrode is the terminal electrode.

22. An electronic component comprising:

a single-layer glass plate;

at least one outer-surface conductor that is disposed above an outer surface of the single-layer glass plate and that is at least a part of an electrical element; and at least one terminal electrode that is a terminal of the electrical element, the terminal electrode being disposed above the outer surface of the single-layer glass plate and being electrically connected to the outer-surface conductor, wherein the single-layer glass plate includes a reinforcing portion that is harder than a vicinity thereof.

23. The electronic component according to claim 22, wherein the reinforcing portion is positioned below the outer-surface conductor or below the terminal electrode.

* * * * *